(12) United States Patent
Kondo et al.

(10) Patent No.: US 6,295,008 B1
(45) Date of Patent: * Sep. 25, 2001

(54) METHOD AND APPARATUS FOR TRUNCATED DECODING

(75) Inventors: Tetsujiro Kondo, Kanagawa-Prefecture (JP); James J. Carrig, San Jose; Yasuhiro Fujimori, Cupertino, both of CA (US); Sugata Ghosal, New Delhi (IN)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/342,332

(22) Filed: Jun. 29, 1999

Related U.S. Application Data

(63) Continuation-in-part of application No. 09/249,500, filed on Feb. 12, 1999.

(51) Int. Cl.[7] .................................................. H03M 7/00

(52) U.S. Cl. ............................. 341/50; 341/51; 348/405

(58) Field of Search ............................ 341/30, 51, 65, 341/63; 348/405

(56) References Cited

U.S. PATENT DOCUMENTS

| | | |
|---|---|---|
| 3,311,879 | 3/1967 | Daher . |
| 3,805,232 | 4/1974 | Allen . |
| 4,381,519 | 4/1983 | Wilkinson et al. ............... 358/21 R |
| 4,419,693 | 12/1983 | Wilkinson et al. ............... 358/167 |
| 4,532,628 | 7/1985 | Matthews ............................ 371/13 |
| 4,703,351 | 10/1987 | Kondo ................................ 358/135 |
| 4,703,352 | 10/1987 | Kondo ................................ 358/135 |
| 4,710,811 | 12/1987 | Kondo ................................ 358/135 |
| 4,722,003 | 1/1988 | Kondo ................................ 358/135 |
| 4,729,021 | 3/1988 | Kondo . |
| 4,772,947 | 9/1988 | Kono ................................. 358/135 |
| 4,788,589 | 11/1988 | Kondo ................................ 358/133 |
| 4,815,078 | 3/1989 | Shimura .............................. 370/30 |
| 4,845,560 | 7/1989 | Kondo et al. ....................... 358/133 |

(List continued on next page.)

FOREIGN PATENT DOCUMENTS

| | | | |
|---|---|---|---|
| 0 359 729 A2 | 8/1989 | (EP) . | |
| 0 527 611 | 8/1992 | (EP) | ................... H04N/9/80 |
| 0 558 016 | 2/1993 | (EP) | ................... H04N/7/133 |
| 0 596 826 | 11/1993 | (EP) | ................... H04N/5/92 |
| 0 610 587 | 12/1993 | (EP) . | |
| 0 680 209 | 4/1995 | (EP) | ................... H04N/5/91 |
| 0 833 517 | 4/1998 | (EP) | ................... H04N/7/30 |
| 7-67028 | 3/1995 | (JP) | ................... H04N/5/235 |
| WO99/21369 | 4/1999 | (WO) . | |

OTHER PUBLICATIONS

Kondo, et al., "Adaptive Dynamic Range Coding Scheme for Future HDTV Digital VTR", Fourth International Workshop on HDTV and Beyond, Sep. 4–6, Turin, Italy.

Kondo, et al., "A New Concealment Method for Digital VCR's", IEEE Visual Signal Processing and Communication, pp. 20–22, 9/93, Melbourne, Australia.

Park, et al., "A Simple Concealment for ATM Bursty Cell Loss", IEEE Transactions on Consumer Electronics, No. 3, Aug. 1993, pp. 704–709.

(List continued on next page.)

*Primary Examiner*—Peguy Jeanpierre
(74) *Attorney, Agent, or Firm*—Blakely, Sokoloff, Taylor & Zafman LLP

(57) ABSTRACT

A method and apparatus for hardware efficient decoding of compression coefficients. In one embodiment, a numerator of an equation used to compute a compression coefficient is computed. The denominator is also computed. The numerator and denominator values are truncated such that each numerator and denominator are equal in length to a predetermined constant K. A K-bit integer division is then executed to determine the value of the compression constant.

18 Claims, 20 Drawing Sheets

U.S. PATENT DOCUMENTS

| | | | |
|---|---|---|---|
| 4,885,636 | 12/1989 | Sullivan | 358/133 |
| 4,890,161 | 12/1989 | Kondo | 358/135 |
| 4,924,310 | 5/1990 | Von Brandt | 358/136 |
| 4,953,023 | 8/1990 | Kondo | 358/135 |
| 4,975,915 | 12/1990 | Sako et al. . | |
| 5,023,710 | 6/1991 | Kondo et al. | 358/133 |
| 5,122,873 | 6/1992 | Golin | 358/133 |
| 5,134,479 * | 7/1992 | Ohishi et al. | 358/140 |
| 5,142,537 | 8/1992 | Kutner et al. | 371/31 |
| 5,159,452 | 10/1992 | Kinoshita et al. | 358/141 |
| 5,185,746 | 2/1993 | Tanaka et al. | 371/40.1 |
| 5,196,931 | 3/1993 | Kondo | 358/133 |
| 5,208,816 | 5/1993 | Seshardi et al. | 371/43 |
| 5,237,424 | 8/1993 | Nishino et al. | 358/310 |
| 5,241,381 | 8/1993 | Kondo | 358/133 |
| 5,258,835 | 11/1993 | Kato | 358/135 |
| 5,307,175 | 4/1994 | Seachman | 348/401 |
| 5,327,502 | 7/1994 | Masuda et al. | 382/56 |
| 5,359,694 | 10/1994 | Concordel | 358/445 |
| 5,379,072 | 1/1995 | Kondo | 348/441 |
| 5,398,078 | 3/1995 | Masuda et al. | 348/699 |
| 5,416,651 | 5/1995 | Uetake et al. | 360/48 |
| 5,416,847 | 5/1995 | Boze | 381/94 |
| 5,428,403 | 6/1995 | Andrew et al. | 348/699 |
| 5,434,716 | 7/1995 | Sugiyama et al. | 360/32 |
| 5,438,369 | 8/1995 | Citta et al. | 348/470 |
| 5,469,216 | 11/1995 | Takahashi et al. | 348/441 |
| 5,469,474 * | 11/1995 | Kitabatake | 375/243 |
| 5,471,501 | 11/1995 | Parr et al. | 375/354 |
| 5,481,554 | 1/1996 | Kondo | 371/53 |
| 5,481,627 | 1/1996 | Kim | 382/254 |
| 5,495,298 | 2/1996 | Uchida et al. . | |
| 5,528,608 | 6/1996 | Shimizume | 371/40.3 |
| 5,598,214 | 1/1997 | Kondo et al. | 348/414 |
| 5,617,333 | 4/1997 | Oyamada et al. | 364/514 R |
| 5,625,715 | 4/1997 | Trew et al. | 382/236 |
| 5,649,053 * | 7/1997 | Kim | 395/2.38 |
| 5,663,764 | 9/1997 | Kondo et al. | 348/414 |
| 5,703,889 | 12/1997 | Shimoda et al. | 371/55 |
| 5,724,099 | 3/1998 | Hamdi et al. | 348/419 |
| 5,751,743 | 5/1998 | Takizawa | 371/41 |
| 5,751,862 | 5/1998 | Williams et al. | 348/401 |
| 5,786,857 * | 7/1998 | Yamaguchi | 348/405 |
| 5,796,786 | 8/1998 | Lee | 375/326 |
| 5,805,762 | 9/1998 | Boyce et al. | 386/68 |
| 5,852,470 | 12/1998 | Kondo et al. | 348/448 |
| 5,928,318 * | 7/1999 | Araki | 708/650 |
| 5,946,044 | 8/1999 | Kondo et al. . | |
| 6,067,636 | 5/2000 | Yao et al. | 714/15 |

OTHER PUBLICATIONS

Tom, et al., "Packet Video for Cell Loss Protection Using Deinterleaving and Scrambling", ICASSP 91: 1991 International Conference on Acoustics, Speech and Signal Processing, vol. 4, pp. 2857–2860, Apr. 1991.

NHK Laboratories Note, "Error Correction, Concealment and Shuffling", No. 424, Mar. 1994, pp. 29–44.

Translation of Japanese Patent #7–67028, 30 pgs.

Kondo, et al., "Adaptive Dynamic Range Coding Scheme for Future Consumer Digital VTR", pp. 219–226.

Kim, et al., "Bit Rate Reduction Algorithm for a Digital VCR", IEEE Transactions on Consumer Electronics, vol. 37, No. 3, Aug. 1, 1992, pp. 267–274.

R.C. Gonzalez, et al., "Digital Image Processing", Addison Wesley Publishing Compant, Inc., 1992, pp. 346–348.

R. Aravind, et al., "Image and Video Coding Standards", AT&T Technical Journal, Jan./Feb. 1993, pp. 67–88.

Zhu, et al., "Coding and Cell–Loss Recovery in DCT–Based Packet Video", IEEE Transactions on Circuits and Systems for Video Technology, Jun. 3, 1993, No. 3, NY.

International Search Report, PCT/US98/22347, Mar. 16, 1999, 2 pgs.

International Search Report, PCT/US95/22531, Apr. 1, 1999, 1 pg.

International Search Report, PCT/US98/22411, Feb. 25, 1999, 1 pg.

Japanese Patent No. 05304659 and translation of Abstract.
Japanese Patent No. 05244578 and translation of Abstract.
Japanese Patent No. 05300485 and translation of Abstract.
Japanese Patent No. 06070298 and translation of Abstract.
Japanese Patent No. 06006778 and translation of Abstract.
Japanese Patent No. 06113256 and translation of Abstract.
Japanese Patent No. 06113275 and translation of Abstract.
Japanese Patent No. 06253287 and translation of Abstract.
Japanese Patent No. 06253280 and translation of Abstract.
Japanese Patent No. 06253284 and translation of Abstract.
Japanese Patent No. 06350981 and translation of Abstract.
Japanese Patent No. 06350982 and translation of Abstract.
Japanese Patent No. 08317394 and translation of Abstract.
Japanese Patent No. 07023388 and translation of Abstract.
Japanese Patent No. 04245881 and translation of Abstract.
Japanese Patent No. 04115628 and translation of Abstract.
Japanese Patent No. 04115686 and translation of Abstract.
Translation of Abstract of Japanese Patent No. 61147690.
Translation of Abstract of Japanese Patent No. 63256080.
Translation of Abstract of Japanese Patent No. 63257390.
Translation of Abstract of Japanese Patent No. 02194785.
Translation of Abstract of Japanese Patent No. 03024885.
Translation of Abstract of Japanese Patent No. 04037293.
Translation of Abstract of Japanese Patent No. 04316293.
Translation of Abstract of Japanese Patent No. 04329088.
Translation of Abstract of Japanese Patent No. 05047116.
Translation of Abstract of Japanese Patent No. 05244579.
Translation of Abstract of Japanese Patent No. 05244580.
Translation of Abstract of Japanese Patent No. 05244559.
Translation of Abstract of Japanese Patent No. 05304659.
Translation of Abstract of Japanese Patent No. 06086259.
Translation of Abstract of Japanese Patent No. 06113258.
Translation of Abstract of Japanese Patent No. 06125534.
Translation of Abstract of Japanese Patent No. 06162693.
Translation of Abstract of Japanese Patent No. 06253287.
Translation of Abstract of Japanese Patent No. 06253280.
Translation of Abstract of Japanese Patent No. 06253284.
Translation of Abstract of Japanese Patent No. 07046604.
Translation of Abstract of Japanese Patent No. 07085611.
Translation of Abstract of Japanese Patent No. 07095581.
Translation of Abstract of Japanese Patent No. 07177505.
Translation of Abstract of Japanese Patent No. 07177506.
Translation of Abstract of Japanese Patent No. 07240903.

International Search Report PCT/US00/03743, 4 pgs., Feb. 11, 2000.

International Search Report PCT/US00/14245, Sep. 15, 2000, 9 pgs.

King Ip chan, et al., XP–002131882, *"Block Shuffling on Top of Error Concealment for Wireless Image Transmissions"*, pp. 977–981, 1996 IEEE.

Huifang Sun, et al., *"Error Concealment Algorithms for Robust Decoding of MPEP Compressed Video"*, Apr. 19, 1995, pp. 250–267.

Richard Brush, XP-002075974, "Video Data Shuffling for the 4:2:2 DVTR", SMPTE Journal Oct. 1996, pp. 1009–1016.

International Search Report PCT/US00/15679, 7 pgs., Oct. 24, 2000.

International Search Report PCT/US00/16611, 7 pgs., Oct. 17, 2000.

* cited by examiner

- POSSIBLE CASES FOR $(m_i, q_i)$ (x indicates unknown)

| $(m_i, q_i)$ | Possible values of $d_i$ | Number of possibilities $(n_j)$ |
|---|---|---|
| $(m_i = m, q_i = q)$ | $\{5m + q\}$ | 1 |
| $(m_i = x, q_i = 0)$ | $\{0\}$ | 1 |
| $(m_i = x, q_i > 0)$ | $\{q_i, 5 + q_i\}$ | 2 |
| $(m_i = 0, q_i = x)$ | $\{0, 1, 2, 3, 4\}$ | 5 |
| $(m_i = 1, q_i = x)$ | $\{6, 7, 8, 9\}$ | 4 |
| $(m_i = x, q_i = x)$ | $\{0, 1, 2, 3, 4, 6, 7, 8, 9,\}$ | 9 |

- GENERATE ALL $M = n_2 \times n_1 \times n_0$ POSSIBLE KEYS

*FIG. 7*

MEASUREMENTS: SQUARE ERROR $$S.E. = \sum_i \sum_j (x_i - y_{i,j})^2 \quad *$$

where $x_i$ is the (candidate) decoded value of pixel i
$y_{ij}$ is a horizontal or vertical neighbor of $x_i$

*NOTE: Current implementation discards 3 largest terms, i.e., $(x_i - y_{i,j})^2$

FIG. 8a

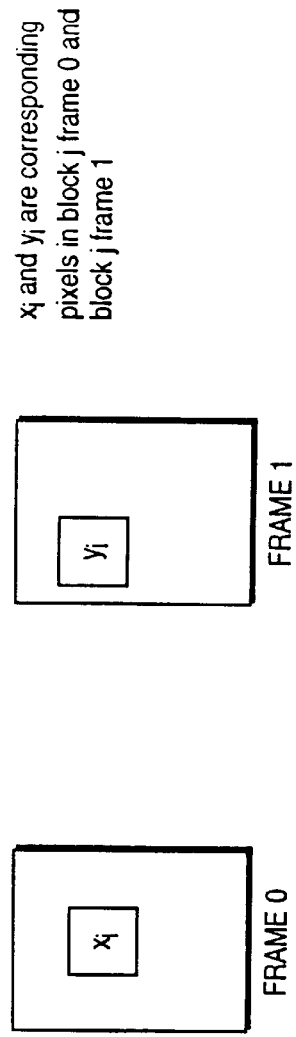

MEASUREMENTS: TEMPORAL ACTIVITY $x_i$ and $y_i$ are corresponding pixels in block j frame 0 and block j frame 1

$$T.A. = \max |y_i - x_i|\ i\ \text{in block}\ j$$

FIG. 8b

PROBABILITY FUNCTION

S.E. Probalities

| S.E. Probability | S.E. <=2^(9) | 2^(9) < S.E. <= 2^(11) | 2^(11) < S.E. <= 2^(13) | 2^(13) < S.E. <= 2^(15) |
|---|---|---|---|---|
| conf = 0 | 0.400607 | 0.486165 | 0.497679 | 0.499834 |
| 0 < conf <= 0.1 | 0.108873 | 0.097436 | 0.089769 | 0.102244 |
| 0.1 < conf <= 0.2 | 0.044734 | 0.014264 | 0.014457 | 0.004728 |
| 0.2 < conf <= 0.3 | 0.016635 | 0.001637 | 0.001385 | 0.001193 |
| 0.3 < conf <= 0.4 | 0.007419 | 0.000513 | 0.000001 | 0.000001 |
| 0.4 < conf <= 0.5 | 0.001317 | 0.000018 | 0.000022 | 0.000001 |
| 0.5 < conf <= 0.6 | 0.000264 | 0.000026 | 0.000001 | 0.000008 |
| 0.6 < conf <= 0.7 | 0.000141 | 0.000031 | 0.000001 | 0.000001 |
| 0.7 < conf <= 0.8 | 0.000078 | 0.000001 | 0.000001 | 0.000001 |
| 0.8 < conf <= 0.9 | 0.000001 | 0.000001 | 0.000001 | 0.000001 |
| 0.9 < conf <= 1 | 0.000001 | 0.000001 | 0.000001 | 0.000001 |

| S.E. Probability | 2^(15) < S.E. <= 2^(17) | 2^(17) < S.E. <= 2^(19) | 2^(19) < S.E. |
|---|---|---|---|
| conf = 0 | 0.499842 | 0.499689 | 0.498521 |
| 0 < conf <= 0.1 | 0.093066 | 0.091473 | 0.085688 |
| 0.1 < conf <= 0.2 | 0.003602 | 0.003743 | 0.003322 |
| 0.2 < conf <= 0.3 | 0.000001 | 0.000189 | 0.000192 |
| 0.3 < conf <= 0.4 | 0.000001 | 0.000075 | 0.000001 |
| 0.4 < conf <= 0.5 | 0.000001 | 0.000034 | 0.000001 |
| 0.5 < conf <= 0.6 | 0.000001 | 0.000001 | 0.000001 |
| 0.6 < conf <= 0.7 | 0.000001 | 0.000001 | 0.000001 |
| 0.7 < conf <= 0.8 | 0.000001 | 0.000001 | 0.000001 |
| 0.8 < conf <= 0.9 | 0.000001 | 0.000001 | 0.000001 |
| 0.9 < conf <= 1 | 0.000001 | 0.000001 | 0.000001 |

FIG. 9

LAPLACIAN MEASUREMENT

METHOD AND APPARATUS FOR TRUNCATED DECODING

RELATED APPLICATIONS

This application is a continuation-in-part of U.S. patent application Ser. No. 09/249,500, filed Feb. 12, 1999, titled "Method and Apparatus for Truncated Decoding".

BACKGROUND OF THE INVENTION

1. Field of the Invention

The present invention relates to the recovery of data. More particularly, the present invention relates to the recovery of lost/damaged block data in a bitstream of compressed data.

2. Art Background

It is often desirable to compress data, such as video images or sound data, for transmission and storage. Typically, when data is compressed, compression constants are generated. In some instances block-wide data is generated. These constants are transmitted or stored along with the compressed image. Problems can arise if the compression constants are lost or damaged prior to decompression of the data. As an illustration, the discussion below illustrates the problems that arise if image data compression constants are lost.

The discrete data points that make up a digital image are known as pixels. For example, each pixel is represented independently using 8 bits, but other representations also are used for the purposes of compression analysis. Most of the alternative representations begin by dividing this raw data into disjoint sets. For historical reasons, these sets are referred to as "blocks", even though they may not have a traditional block shape. The alternative representation then characterizes the data by some block-wide information and per-pixel information.

Examples of block-wide information include the minimum pixel value (MIN), the maximum pixel value (MAX), and the dynamic range of the pixel values (DR), where DR=MAX−MIN or DR=1+MAX−MIN. Per-pixel information may indicate where the pixel value lies within the range specified by the global information. For compression to be achieved, the per-pixel information must use only a few bits of storage so that the total number of bits used is less than that required to store the raw image.

In one example, the block data is comprised of the MIN, DR and Qbit number (defined below), and the pixel data is comprised of Q codes. A Q code is a Qbit number that corresponds to one value in the set {MIN, MIN+1, . . . , MAX}. Since the Qbit number is generally small and the DR value may be relatively large, it is generally not possible to represent all pixel values exactly. Therefore, some quantization error is introduced when pixel values are reduced to Q code values. For instance, if the Qbit number is 3, then it is generally possible to represent $2^3$=8 values from the set {MIN, MIN+1, . . . , MAX} without any error. Pixels with other values are rounded to one of these eight values. This rounding introduces quantization error.

If any of the block information, e.g., MIN, MAX or DR, is lost, the damage to the image is potentially large as many pixels are affected. For this reason, it is desirable to have techniques for accurately estimating or recovering the values of this lost data.

SUMMARY OF THE INVENTION

A method and apparatus for hardware efficient decoding of compression coefficients. In one embodiment, a numerator of an equation used to compute a compression coefficient is computed. The denominator is also computed. The numerator and denominator values are truncated such that each numerator and denominator are equal in length to a predetermined constant K. A K-bit integer division is then executed to determine the value of the compression constant.

BRIEF DESCRIPTION OF THE DRAWINGS

The objects, features and advantages of the present invention will be apparent to one skilled in the art in light of the following detailed description in which:

FIG. 7 is a table illustrating one embodiment of candidate decodings.

FIGS. 8a, 8b, 8c, 8d illustrate embodiments of measurements utilized in the Qbit and Motion Flag recovery process of FIG. 6.

FIG. 9 illustrates one embodiment of a table used to determine a square error probability function utilized in the Qbit and Motion Flag recovery process of FIG. 6.

DETAILED DESCRIPTION

The present invention provides a method for decoding a bitstream to provide for a robust error recovery. In the following description, for purposes of explanation, numerous details are set forth, in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

The signal processing methods and structures are described from the perspective of one embodiment in which the signals are video signals. However, it is contemplated that the methods and apparatus described herein are applicable to a variety of types of signals including audio signals or other digital bitstreams of data, wherein each signal is composed of multiple signal elements. Furthermore the embodiment of the process described herein utilizes the Adaptive Dynamic Range Coding ("ADRC") process to compress data; however a variety of coding techniques and algorithms may be used. For a more detailed discussion on ADRC, see "Adaptive Dynamic Range Coding Scheme for Future HDTV Digital VTR", Kondo, Fujimori and Nakaya, Fourth International Workshop on HDTV and Beyond, Sep. 4–6, 1991, Turin, Italy.

In the above paper, three different kinds of ADRC are explained. These are achieved according to the following equations:

Non-edge-matching ADRC:

$$DR = MAX - MIN + 1$$

$$q = \left\lfloor \frac{(x - MIN + 0.5) \cdot 2^Q}{DR} \right\rfloor$$

$$x' = \left\lfloor \frac{(q + 0.5) \cdot DR}{2^Q} + MIN \right\rfloor$$

Edge-matching ADRC:

$$DR = MAX - MIN$$

$$q = \left\lfloor \frac{(x - MIN) \cdot (2^Q - 1)}{DR} + 0.5 \right\rfloor$$

$$x' = \left\lfloor \frac{q \cdot DR}{2^Q - 1} + MIN + 0.5 \right\rfloor$$

Multi-stage ADRC:

$$DR = MAX - MIN + 1$$

$$q = \left\lfloor \frac{(x - MIN + 0.5) \cdot 2^Q}{DR} \right\rfloor$$

$$x' = \left\lfloor \frac{[(q + 0.5) \cdot DR]}{2^Q} + MIN \right\rfloor$$

where MAX' is the averaged value of x' in the case of $q = 2^Q - 1$;
MIN' is the averaged value of x' in the case of q=0; and $$DR' = MAX' - MIN'$$

$$q = \left\lfloor \frac{(x - MIN') \cdot (2^Q - 1)}{DR'} + 0.5 \right\rfloor$$

$$x' = \left\lfloor \frac{q \cdot DR'}{(2^Q - 1)} + MIN' + 0.5 \right\rfloor$$

where DR represents a dynamic range value, MAX represents the maximum level of a block, MIN represents the minimum level of a block, x represents the signal level of each sample, Q represents the number of quantization bits (qbit), q represents the quantization code (encoded data or Q code), x' represents the decoded level of each sample, and the square brackets $\lfloor \cdot \rfloor$ represent a truncation operation performed on the value within the square brackets.

Figure 1:
FIG. 1 generally illustrates the processes and apparatus of signal encoding, transmission, and decoding.

The signal encoding, transmission, and subsequent decoding processes are generally illustrated in FIG. 1. Signal 100 is a data stream input to Encoder 110. Encoder 110 follows the Adaptive Dynamic Range Coding ("ADRC") compression algorithm and generates Packets 1, . . . N for transmission along Transmission Media 135. Decoder 120 receives Packets 1, . . . N from Transmission Media 135 and generates Signal 130. Signal 130 is a reconstruction of Signal 100.

Encoder 110 and Decoder 120 can be implemented a variety of ways to perform the functionality described herein. In one embodiment, Encoder 110 and/or Decoder 120 are embodied as software stored on media and executed by a general purpose or specifically configured computer system, typically including a central processing unit, memory and one or more input/output devices and co-processors. Alternately, the Encoder 110 and/or Decoder 120 may be implemented as logic to perform the functionality described herein. In addition, Encoder 110 and/or Decoder 120 can be implemented as a combination of hardware, software or firmware.

In the present embodiment Signal 100 is a color video image comprising a sequence of video frames, each frame including information representative of an image in an interlaced video system. Each frame is composed of two fields, wherein one field contains data of the even lines of the image and the other field containing the odd lines of the image. The data includes pixel values which describe the color components of a corresponding location in the image. For example, in the present embodiment, the color components consist of the luminance signal Y, and color difference signals U, and V. It is readily apparent the process of the present invention can be applied to signals other than interlaced video signals. Furthermore, it is apparent that the present invention is not limited to implementations in the Y, U, V color space, but can be applied to images represented in other color spaces.

Referring back to FIG. 1, Encoder 110 divides the Y, U, and V signals and processes each group of signals independently in accordance with the ADRC algorithm. The following description, for purposes of simplifying the discussion, describes the processing of the Y signal; however, the encoding steps are replicated for the U and V signals.

In the present embodiment, Encoder 110 groups Y signals across two subsequent frames, referred to herein as a frame pair, of Signal 100 into three dimensional blocks ("3D") blocks. For one embodiment, a 3D block is generated from grouping two 2D blocks from the same localized area across a given frame pair, wherein a two dimensional 2D block is created by grouping localized pixels within a frame or a field. It is contemplated that the process described herein can be applied to different block structures. The grouping of signals will be further described in the image-to-block mapping section below. Continuing with the present embodiment, for a given 3D block, Encoder 110 calculates whether there is a change in pixel values between the 2D blocks forming the 3D block. A Motion Flag is set if there are substantial changes in values. As is known in the art, use of a Motion Flag allows Encoder 110 to reduce the number of quantization codes when there is localized image repetition within each frame pair. Encoder 110 also detects the maximum pixel intensity value ("MAX") and the minimum pixel intensity value ("MIN") within a 3D block. Using values MAX and MIN, Encoder 110 calculates the dynamic range ("DR") for a given 3D block of data. For one embodiment DR=MAX−MIN+1 in the case of non-edgematching ADRC. For edge-matching ADRC, DR=MAX−MIN. A central value may also be calculated. For example, in one embodiment, CEN is calculated as $$MIN + \frac{DR}{2}.$$

In an alternative embodiment, Encoder 110 encodes signals on a frame by frame basis for a stream of frames representing a sequence of video frames. In another embodiment, Encoder 110 encodes signals on a field by field basis for a stream of fields representing a sequence of video fields. Accordingly, Motion Flags are not used and 2D blocks are used to calculate the MIN, MAX, CEN, and DR values.

In the present embodiment, Encoder 110 references the calculated DR against a threshold table (not shown) to determine the number of quantization bits ("Qbits") used to encode pixels within the block corresponding to the DR. Encoding of a pixel results in a quantization code ("Q code"). The Q codes are the relevant compressed image data used for storage or transmission purposes.

In one embodiment, the Qbit selection is derived from the DR of a 3D block. Accordingly, all pixels within a given 3D block are encoded using the same Qbit, resulting in a 3D encoded block. The collection of Q codes, MIN or CEN Motion Flag, and DR for a 3D encoded block is referred to as a 3D ADRC block. Alternately, 2D blocks are encoded and the collection of Q codes, MIN or CEN and DR for a given 2D block results in 2D ADRC blocks.

A number of threshold tables can be implemented. In one embodiment, the threshold table consists of a row of DR threshold values. A Qbit corresponds to the number of quantization bits used to encode a range of DR values between two adjacent DRs within a row of the threshold table. In an alternative embodiment, the threshold table includes multiple rows and selection of a row depends on the desired transmission rate. Each row in the threshold table is identified by a threshold index. A detailed description of one embodiment of threshold selection is described below in the discussion of partial buffering. A further description of ADRC encoding and buffering is disclosed in U.S. Pat. No. 4,722,003 entitled "High Efficiency Coding Apparatus" and U.S. Pat. No. 4,845,560 also entitled "High Efficiency Coding Apparatus", assigned to an assignee of the present invention.

The Q codes are referred to as variable length data ("VL-data"). In addition, the DR, MIN, or CEN and Motion Flag are referred to as block attributes or compression constants. The block attributes, together with the threshold index, constitute the fixed length data ("FL-data"). Furthermore, in view of the above discussion, the term block attribute describes a parameter associated with a component of a signal element, wherein a signal element includes multiple components.

Figure 2:
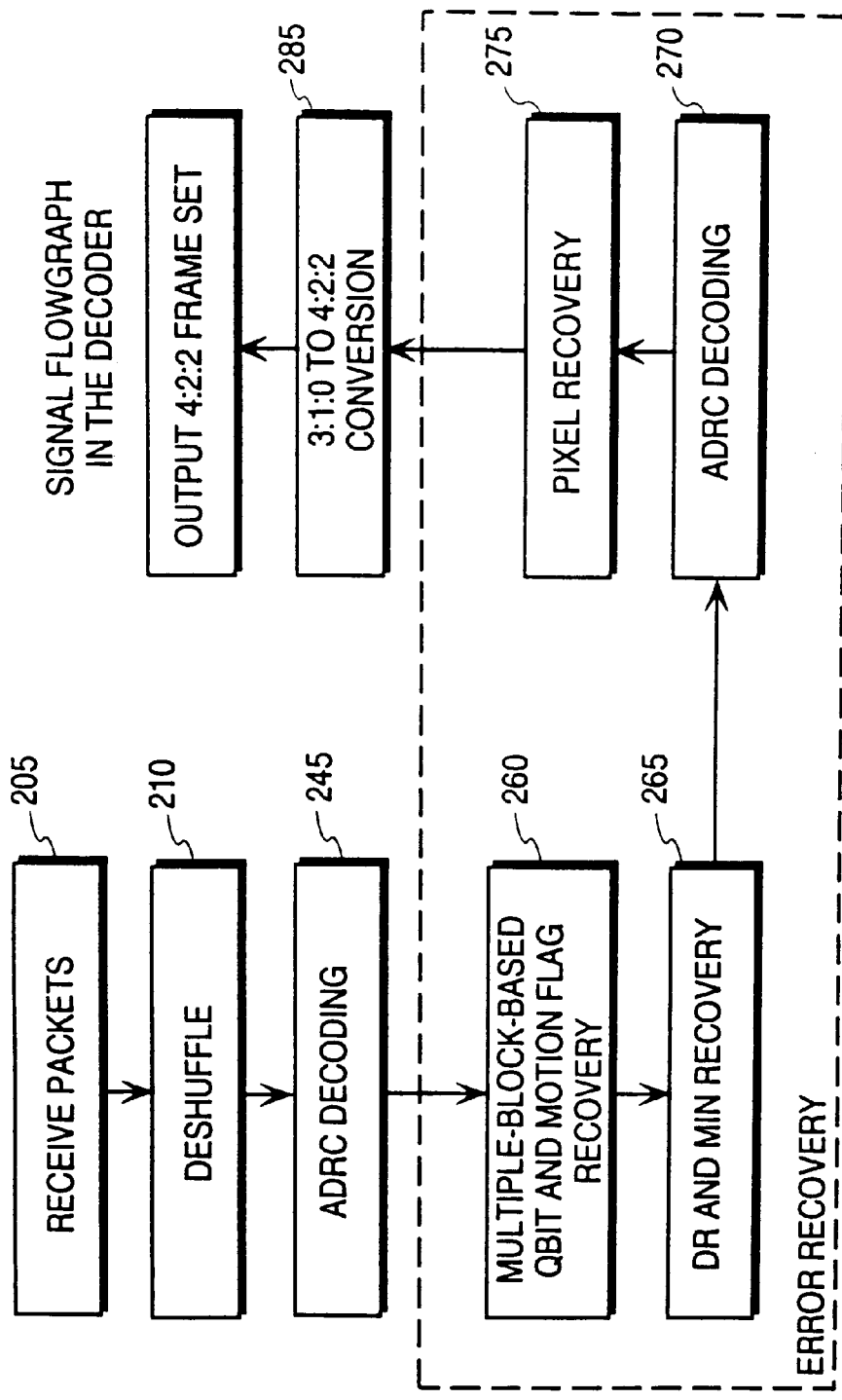
FIG. 2 is a flow diagram illustrating one embodiment of the decoding process in accordance with the teachings of the present invention.

Frames, block attributes, and VL-data describe a variety of components within a video signal. The boundaries, location, and quantity of these components are dependent on the transmission and compression properties of a video signal. The encoded data is formed into packets and transmitted across a transmission media or stored on a storage media. FIG. 2 is a simplified flow diagram illustrating one embodiment of decoding process performed by Decoder 120. FIG. 2 further describes, in different combinations of Qbit, Motion Flag, DR, MIN and pixel data, an innovative process for error recovery. More particularly, a method and apparatus for recovering lost or damaged (lost/damaged) compression constants of data to be decoded is described. In the present embodiment, the lost/damaged compression constants may include DR, MIN, CEN and/or MAX.

Referring to FIG. 2, the data received in packets is processed to decode the data encoded in the received bitstream. At step 205, data is received. In one embodiment, the data may be deshuffled, step 210, if the data was shuffled at time of encoding. ADRC decoding is then applied to the data, step 245, in accordance with the teachings known in the art.

A recovery process is performed to recover the Qbit and Motion Flag values that were located in lost packets. The Qbit value is lost typically due to DR loss (due to lost packets). When the Qbit or Motion Flag value is unknown, the location of Q code bits corresponding to a pixel cannot be determined from the data bitstream. If a Qbit or Motion Flag value is improperly determined then this error will propagate to subsequent data as the starting point of subsequent blocks in the bitstream will be incorrectly identified. A number of techniques may be used to recover Qbit or Motion Flag values.

Figure 3:
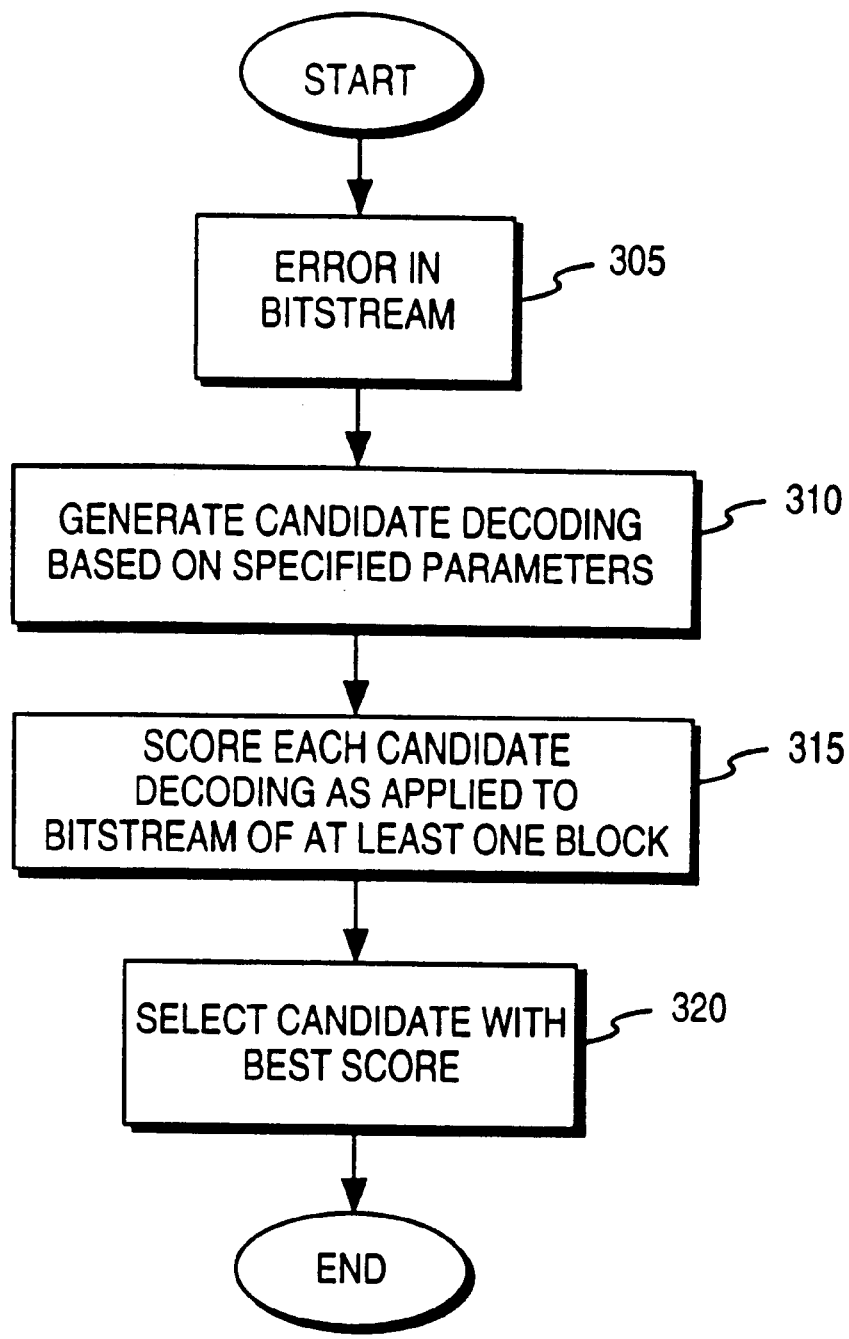
FIG. 3 is a flow diagram generally illustrating one embodiment of the data recovery process of the present invention.

FIG. 3 describes the general process for recovering the Qbit and Motion Flag values in accordance with the teachings of the present invention. This particular embodiment describes the process using multiple blocks of data to recover the Qbit and Motion Flag values; however, the particular number of blocks could be one or more blocks. Referring to FIG. 3, based on the detection of an error in the bitstream, step 305, candidate decodings based on specified parameters are generated for the three blocks examined. At step 315, each candidate decoding is scored on the likelihood that it is an accurate decoding and at step 320, the candidate decoding with the best score is used. The Qbit and Motion Flag values identified enable the subsequent decoding of pixels of the affected blocks.

Referring back to the decoding process of FIG. 2, once the best decoding is selected, any DR, MIN, or CEN values that were lost due to lost packets are recovered, step 265. A variety of recovery processes known to one skilled in the art can be applied to recover DR, MIN and/or CEN, including least squares or the averaging of values of adjacent blocks.

In one embodiment, DR is recovered in accordance with the following equation:

Edge-matching ADRC:

$$DR' = \frac{(2^Q - 1) \cdot \sum_{i=1}^{N}(y_i - 0.5 - MIN) \cdot e_i}{\sum_{i=1}^{N} e_i^2}$$

Non edge-matching ADRC:

$$DR' = \frac{2^Q \cdot \sum_{i=1}^{N}(y_i - MIN) \cdot (e_i + 0.5)}{\sum_{i=1}^{N} (e_i + 0.5)^2}$$

where DR' is the recovered DR value, N represents the number of terms used (e.g., the number of neighboring values $y_i$ used), $e_i$ is the i-th encoded value in an ADRC block and $e_i \in \{0, 1, \ldots 2^Q - 1\}$; $y_i$ is a decoded value of a corresponding adjacent block pixel, MIN is the MIN value of the block and Q is the Qbit value.

In one embodiment, MIN is determined according to the following equation:

Edge-matching ADRC:

$$MIN' = \frac{1}{N} \cdot \sum_{i=1}^{N} \left[ y_i - 0.5 - \left( \frac{DR}{2^Q - 1} \right) \cdot e_i \right]$$

Non edge-matching ADRC:

$$MIN' = \frac{1}{N} \cdot \sum_{i=1}^{N} \left[ y_i - \frac{DR}{2^Q} \cdot (e_i + 0.5) \right]$$

where MIN' is the recovered MIN value and DR is the DR value of the block.

In one embodiment, CEN is determined according to the following equation:

Edge-Matching ADRC:

$$CEN' = \frac{1}{N} \cdot \sum_{i=1}^{N} \left[ y_i - 0.5 - \left( \frac{DR}{2^Q - 1} \right) \cdot e_i \right] + \frac{DR}{2}$$

Non edge-matching ADRC:

$$CEN' = \frac{1}{N} \cdot \sum_{i=1}^{N} \left[ y_i - \frac{DR}{2^Q} \cdot (e_i + 0.5) \right] + \frac{DR}{2}$$

Alternately, the above DR' formulae may be simplified to eliminate second order terms to obtain a more cost-effective solution. As the MIN' formulae do not contain second order terms, no such simplification is necessary. Thus, DR may be determined as follows:

Edge-matching ADRC:

$$DR' = \frac{(2^Q - 1) \cdot \sum_{i=1}^{N} (y_i - 0.5 - MIN)}{\sum_{i=1}^{N} e_i}$$

Non edge-matching ADRC:

$$DR' = \frac{2^Q \cdot \sum_{i=1}^{N} (y_i - MIN)}{\sum_{i=1}^{N} (e_i + 0.5)}$$

In another embodiment, if the DR and MIN or DR and CEN of the same block are damaged at the same time, DR and MIN or alternately, DR and CEN may be recovered according to the following equations:

Non edge-matching ADRC:

$$DR' = \frac{2^Q \cdot \left[ N \cdot \sum_{i=1}^{N} (e_i + 0.5) \cdot y_i - \sum_{i=1}^{N} (e_i + 0.5) \cdot \sum_{i=1}^{N} y_i \right]}{N \cdot \sum_{i=1}^{N} (e_i + 0.5)^2 - \left[ \sum_{i=1}^{N} (e_i + 0.5) \right]^2}$$

$$MIN' = \frac{\sum_{i=1}^{N} \left[ y_i - \frac{DR'}{2^Q} \cdot (e_i + 0.5) \right]}{N}$$

Edge-matching ADRC:

$$DR' = \frac{(2^Q - 1) \cdot \left[ N \cdot \sum_{i=1}^{N} e_i \cdot y_i - \sum_{i=1}^{N} e_i \cdot \sum_{i=1}^{N} y_i \right]}{N \cdot \sum_{i=1}^{N} e_i^2 - \left[ \sum_{i=1}^{N} e_i \right]^2}$$

$$MIN' = \frac{\sum_{i=1}^{N} \left[ y_i - \frac{DR'}{2^Q - 1} \cdot e_i \right]}{N}$$

Similarly, if DR and CEN of the same block are damaged at the same time, DR and CEN may be recovered according to the following equations:

Non edge-matching:

$$DR' = \frac{2^Q \cdot \left[ N \cdot \sum_{i=1}^{N} (e_i + 0.5) \cdot y_i - \sum_{i=1}^{N} (e_i + 0.5) \cdot \sum_{i=1}^{N} y_i \right]}{N \cdot \sum_{i=1}^{N} (e_i + 0.5)^2 - \left[ \sum_{i=1}^{N} (e_i + 0.5) \right]^2}$$

$$CEN' = \frac{\sum_{i=1}^{N} \left[ y_i - \frac{DR'}{2^Q} \cdot (e_i + 0.5) \right]}{N} + \frac{DR}{2}$$

Edge-matching:

$$DR' = \frac{(2^Q - 1) \cdot \left[ N \cdot \sum_{i=1}^{N} e_i \cdot y_i - \sum_{i=1}^{N} e_i \cdot \sum_{i=1}^{N} y_i \right]}{N \cdot \sum_{i=1}^{N} e_i^2 - \left[ \sum_{i=1}^{N} e_i \right]^2}$$

$$CEN' = \frac{\sum_{i=1}^{N} \left[ y_i - \frac{DR'}{2^Q - 1} \cdot e_i \right]}{N} + \frac{DR}{2}$$

Alternately, a hardware efficient implementation may be used to determine the compression constants DR, MIN and CEN. In one embodiment, MIN is determined according to the following equation:

$$MIN' = \frac{1}{N} \cdot \sum_{i=1}^{N} \left[ y_i - \frac{DR}{2^Q} \cdot (e_i + 0.5) \right]$$

where $e_i$ represents encoded data of the block.

The equation can be expanded to a quotient consisting of a numerator calculation and denominator calculation:

$$MIN' = \frac{2^{Q+1} \cdot \sum_{i=1}^{N} y_i - DR \cdot \sum_{i=1}^{N} \cdot (2 \cdot e_i + 1)}{2^{Q+1} \cdot N}$$

Similarly, with respect to DR, DR is estimated as follows:

$$DR' = \frac{2^Q \cdot \sum_{i=1}^{N} (y_i - MIN)}{\sum_{i=1}^{N} (e_i + 0.5)}$$

The above equation can be expanded to:

$$DR' = \frac{2^{Q+1} \cdot \sum_{i=1}^{N} (y_i - MIN)}{\sum_{i=1}^{N} (2 \cdot e_i + 1)}$$

Similarly for CEN:

$$CEN' = \frac{1}{N} \cdot \sum_{i=1}^{N} \left(y_i - \frac{DR}{2^Q} \cdot q_i\right) + \frac{DR}{2^Q} \cdot (2^{Q-1} - 1/2)$$

This equation can be expanded to:

$$CEN' = \frac{DR \cdot N \cdot (2^{Q-1}) + 2^{Q+1} \cdot \sum_{i=1}^{N} y_i - 2 \cdot N \cdot DR \cdot \sum_{i=1}^{N} q_i}{2^{Q+1} \cdot N}$$

Figure 4:
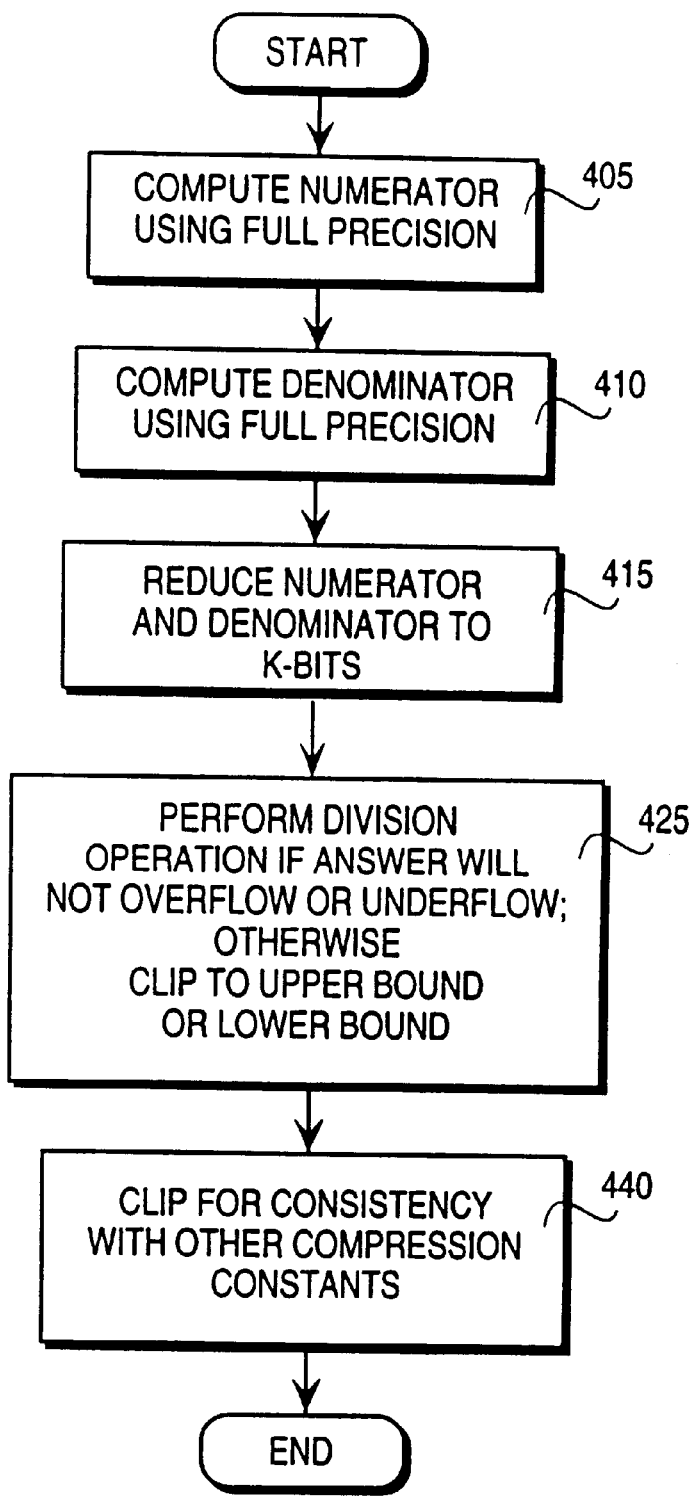
FIG. 4 is a flow chart illustrating one embodiment of the process of the present invention.

The equations above can be efficiently implemented and executed in hardware. One embodiment of the process is illustrated in FIG. 4. At step 405, the numerator value is determined using full precision. At step 410, the denominator is determined using full precision. At step 415, the numerator and the denominator are reduced to at least K-bits in length. For example, in one embodiment:

while ($n \geq 2^K$ or $d \geq 2^K$), then
  n/2 (shift off LSB)
  d/2 (shift off LSB).

In one embodiment, the numerator and denominator are shifted the same number of bits. Alternately, the numerator and denominator may be shifted differing number of bits; in such an embodiment, the different amounts of shifts may be compensated for in subsequent computations.

A value of K is selected such that integer division can be performed using cost efficient logic while maintaining an acceptable image quality. In one embodiment, K is selected such that the maximum error is not usually detectable, e.g., the maximum error is not greater than 3%. In the present embodiment in which an 8 bit encoding is used, K is selected to be 13.

At step 425, the division operation is performed if the answer does not overflow or underflow. If an underflow or overflow occurs, the value is respectively clipped to the lower bound or upper bound. This may be determined by comparing the numerator to values corresponding to the product of the bound and the denominator. In the present example, the following steps would therefore be performed:

For MIN:
  if $n \geq (U_M \cdot d)$
    MIN=$U_M$ (clip to upper bound)
  else if $n \leq (L_M \cdot d)$
    MIN=$L_M$ (clip to lower bound)
  else
    MIN=n/d (K bit division)

where $L_M$ represents the lower bound of MIN allowed by auxiliary information, and $U_M$ represents the upper bound of MIN allowed by auxiliary information.

Auxiliary information, in one embodiment, consists of predefined compression information used for a particular application. In one embodiment, the lower and upper bounds are respectively the lower and upper bounds of the range of pixel values represented by the number of quantization bits used. Furthermore, the range can be restricted to MIN+DR$\leq$MAX, or equivalent, $$CEN + \frac{DR}{2} \leq MAX$$

where MAX is the maximum pixel value. In one embodiment, for 8 bit encoding, MAX is equal to 255.
Similarly, for DR:
  if $n \geq (U_D \cdot d)$
    DR=$U_D$ (clip to upper bound)
  else if $n \leq (L_d \cdot d)$
    DR=$L_D$ (clip to lower bound)
  else DR=n/d (K bit division)

where $L_D$ represents the lower bound of DR allowed by auxiliary information, and $U_D$ represents the upper bound of DR allowed by auxiliary information. The bounds for DR are similarly determined as discussed above.

For CEN:
  if $n \geq (U_C \cdot d)$
    CEN=$U_C$ (clip to upper bound)
  else if $n \leq (L_C \cdot d)$
    CEN=$L_C$ (clip to lower bound)
  else CEN=n/d (K bit division)

where $L_C$ represents the lower bound on CEN allowed by auxiliary information and $U_C$ represents the upper bound of CEN allowed by auxiliary information. The bounds for CEN are similarly determined as discussed above.

At step 430, the value is clipped for consistency with the auxiliary information available, for example other available compression constants. In the present example, the value is clipped according to the following equation which comprises the functions for clipping to a lower bound or upper bound:

For MIN:

$$MIN = \max(\min(MIN, U_{MD} - DR), L_M)$$

where max represents a maximum function, min represents a minimum function, and $U_{MD}$ represents the upper bound defined by MIN+DR;

Similarly, for DR:
  DR=max(min(DR,$U_{MD}$−MIN),$L_D$); or
  DR=max(min(DR,$U_{CD}$−CEN),$L_C$)

It follows for CEN:

$$CEN = \max\left(\min\left(CEN, U_{CD} - \frac{DR}{2}\right), L_C\right)$$

Figure 5A:
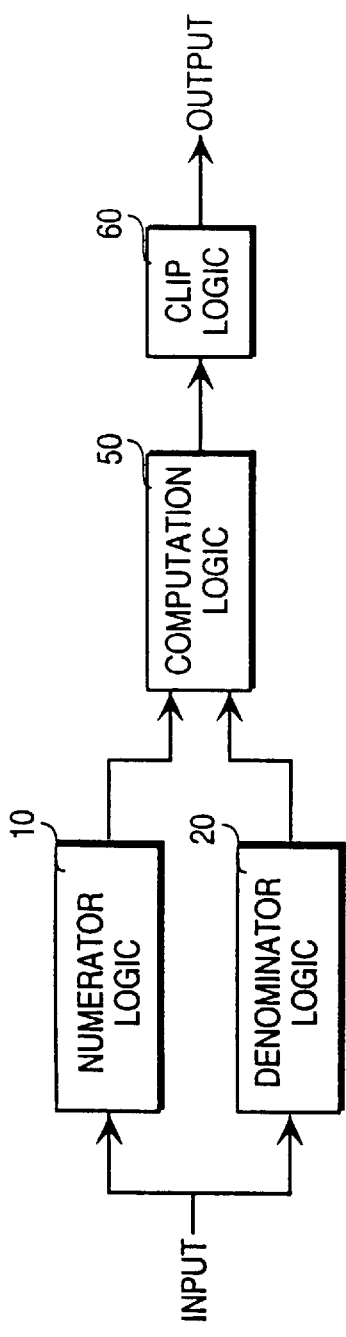
FIGS. 5a and 5b illustrate embodiments of the system of the present invention.
Figure 5B:
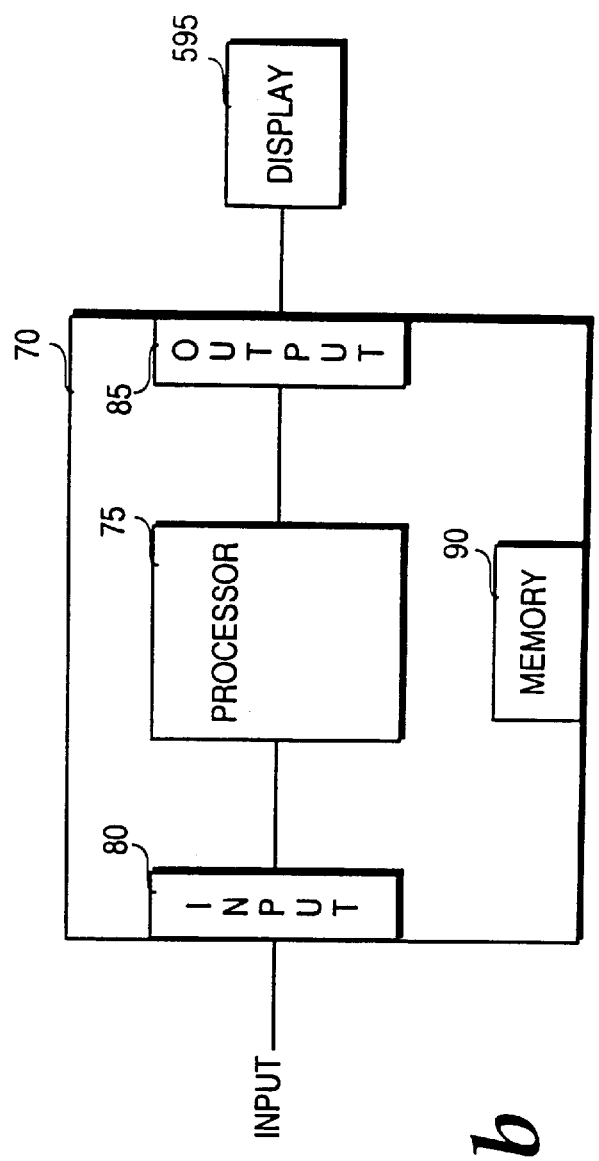

One embodiment of circuitry used to implement the hardware efficient implementation described above is illustrated in the simplified functional block diagram of FIG. 5a. For example, the circuitry may be implemented in specially configured logic, such as large scale integration (LSI) logic or programmable gate arrays. Alternately, as is illustrated in FIG. 5b, the circuitry may be implemented as code executed by a dedicated, specially configured or general purpose processor, which executes instructions stored in a memory or other storage device. Furthermore, the present invention may be implemented as a combination of the above.

Referring to FIG. 5a, numerator logic 510 determines the full precision value of the numerator portion of the computation performed to estimate a lost/damaged compression constant in the encoded domain. Denominator logic 520 similarly determines a full precision value of the denominator portion of the computation. A least significant bit shift operation is performed on the numerator and denominator until the numerator and denominator are each, at a minimum, K-bits in length. In one embodiment, the shift operation is performed by computation logic 550. Alternately, K-bit shift registers may be used to shift out least significant bits of the values generated by logic 510, 520 until the numerator and denominator are K-bits in length.

As will be described in more detail below, K is chosen, for example, empirically, such that the amount of logic/hardware required to perform subsequent operations is minimized for efficiency while maintaining an acceptable level of precision.

Computation logic 550 performs an integer division of the numerator and denominator. If an overflow or underflow will occur, the value is clipped to an upper bound or lower bound respectively defined by known compression constants.

Clip logic 560 is optionally included to clip the output of computation logic 550 to be consistent with other available compression constants. For example, the value may be clipped to a lower bound of the compression constant as best estimated based upon auxiliary information that defines the range of compression values. This information may be predefined according to the particular embodiment of encoding and decoding processes. Thus, this structure provides a fast, cost efficient circuit for estimating lost/damaged compression constants.

The output of the circuit is preferably coupled to additional logic (not shown) which decodes using data including the recovered compression constant. In one embodiment in which the data is image data, the decoded data is used to drive a display device.

An alternate embodiment of the circuit for recovering lost/damaged compression constants is shown in FIG. 5b. The methods described herein can be implemented on a specially configured or general purpose processor system 570. Instructions are stored in the memory 590 and accessed by the processor 575 to perform many of the steps described herein. An input 580 receives the input bitstream and forwards the data to the processor 575. The output 585 outputs the data. In one embodiment, the output may consist of the decoded data, such as image data decoded once the compression constant is recovered, sufficient to drive an external device such as display 595. In another embodiment, the output 585 outputs the recovered compression constant. The recovered compression constant is then input to other circuitry (not shown) to generate the decoded data.

Referring back to FIG. 2, at step 270, ADRC decoding is applied to those blocks not previously decoded. A pixel recovery process is executed, step 275, to recover any erroneous pixel data that may have occurred due to lost packets or random errors. In addition a 3:1:0→4:2:2 back conversion is performed, step 280, to place the image in the desired format for display.

Figure 6:
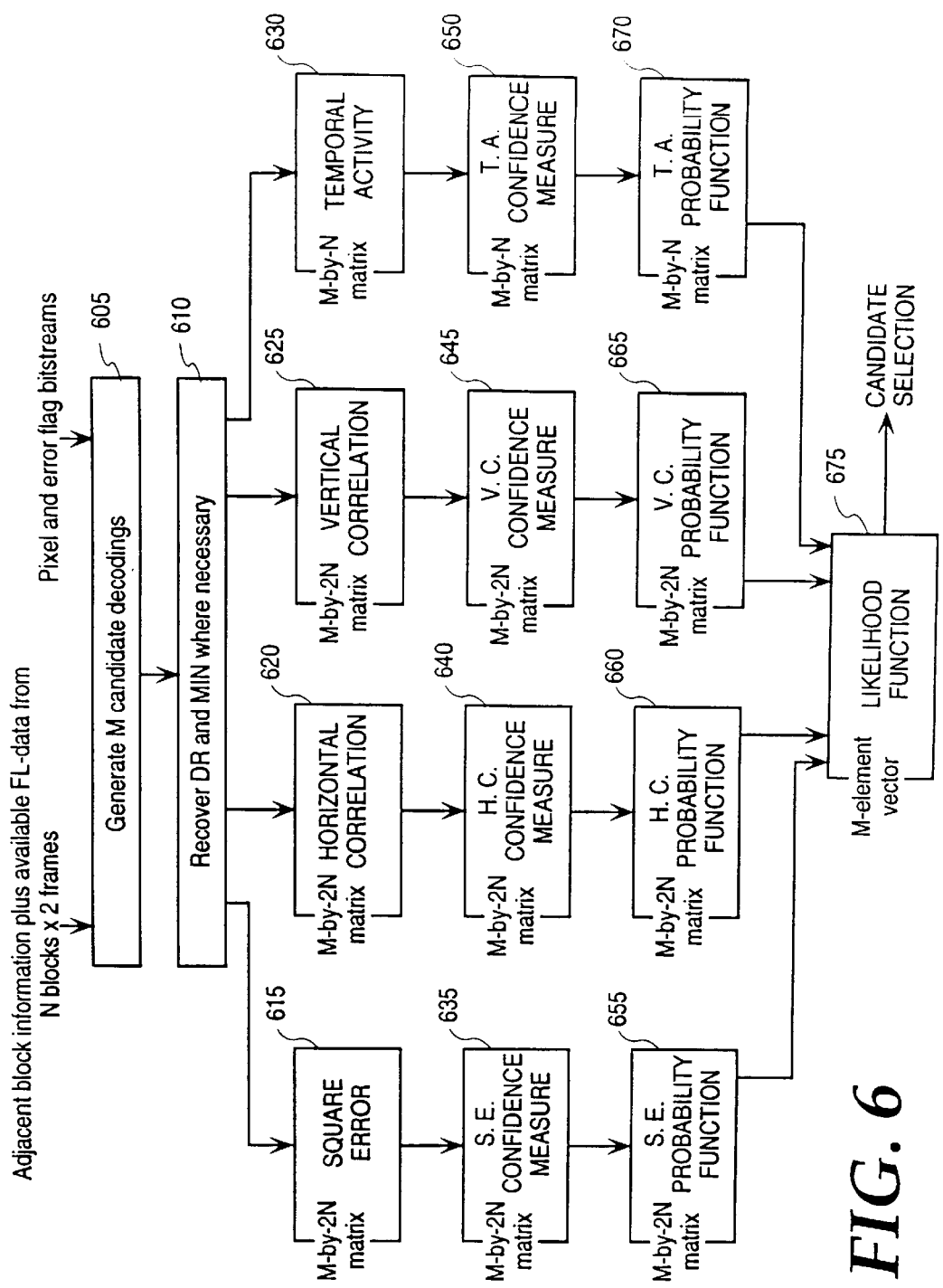
FIG. 6 is a flow diagram of one embodiment of the Qbit and Motion Flag recovery process of the present invention.

FIG. 6 illustrates one particular embodiment of the Qbit and Motion Flag recovery process of the decoding process of the present invention. In this particular embodiment, the inputs to the process are adjacent block information. The block attributes include a compression constant and pixel data for the three blocks to be processed. Error flags indicating the location of the lost data are also input. The error flags can be generated in a variety of ways known to one skilled in the art and will not be discussed further herein except to say that the flags indicate which bits were transmitted by damaged or lost packets.

At step 605, the candidate decodings are generated. The candidate decodings can be generated a variety of ways. For example, although the processing burden would be quite significant, the candidate decodings can include all possible decodings. Alternately, the candidate decodings can be generated based on pre-specified parameters to narrow the number of candidate decodings to be evaluated.

In one embodiment, the candidate decodings are determined based on the possible key values used to shuffle the encoded data. In addition, it should be noted that candidate decodings are further limited by the length of the bits remaining to be decoded and knowledge of how many blocks remain. For example, as will be discussed, if processing the last block typically the decoding length of that block is known.

In one embodiment, shuffling is performed using a masking key. Thus, during the encoding process, a key, referred to herein as KEY, is used to mask a bitstream of Q codes. KEY may be used to mask a bitstream of Q codes corresponding to three blocks of data. Each key element ($d_i$) of the masking key is generated by the combination of certain compression constants, used to encode a corresponding block of data.

For example, in one embodiment, the MF and Qbit values are used to define KEY. Alternately, the masking key is generated from DR and MIN values. More particularly, for 4 bit ADRC encoding which uses MF and Qbit values to generate KEY, the value of the key elements composing KEY are determined in accordance with the following equation:

$$d_i = 5 \cdot m_i + q_i \text{ where } i=0,1,2$$

and $q_i$ represents the number of quantization bits; $q_i = 0, 1, 2, 3, 4$ and m represents the motion flag (MF) value, for example, 0 for a stationary block and 1 for a motion block.

Continuing with the present example, if KEY is generated using three blocks, KEY is formed according to the following:

$$KEY = d_0 + 10 \cdot d_1 + 100 \cdot d_2$$

It therefore follows that during recovery of MF of Qbit data, possible KEY values are regenerated depending upon the values used to create the masking keys. The regenerated KEY values are used to unmask the received bitstream of Q codes resulting in candidate encoded data. Thus, if the MF or Qbit value used to generate the mask is not correct, the corresponding Q codes will exhibit a low level of correlation, which will be typically readily detectable.

Continuing with the present example, FIG. 7 illustrates possible cases for the present embodiment, where the value x indicates an unknown value (which may be due to packet loss). This is further explained by example. The variable $m_i$ is defined as the Motion Flag of the i-th block, $q_i$ is the number of the quantization bits of the i-th block, $n_i$ is the number of possible candidates of the i-th block and $d_i$ is the value of a key element of the i-th block. The i-th block is defined within each group.

In this example, the number of blocks within each group is three. A key for the three block group is generated as, $d_0+10 \cdot d_1+100 \cdot d_2$. Assuming that in the first block the Motion Flag is unknown and the number of quantization bits is 2, $m_0$ equals x and $q_0$ equals 2. Following the equation described above to generate the key element, $d_i=5 \cdot m_i+q_i$, the set of possible digits for $d_0$ consists of {2 and 7}. Thus, the number of possible values ($n_0$) is 2.

Assuming the second block to have a Motion Flag value of 1 and one quantization bit, and the value for $d_1$ is 5.1+1=6 and $n_1=1$. The third block has a Motion Flag value of 1 and an unknown number of quantization bits. Thus, the digit $d_2$ includes a set consisting of {6, 7, 8, 9} and $n_2=4$. Thus, the number of possible candidates of this group, M, is 2·1·4=8, and the keys used to generate the candidate decodings are the variations of 662, 667, 762, 767, 862, 867, 962, 967. This process is preferably used for each group which was affected by data loss.

As noted in FIG. 3, at step 315, once the data has been decoded in accordance with the key data, the candidate decodings generated are evaluated or scored on the likelihood that it is a correct decoding of the data. Furthermore, at step 320, the candidate decoding with the best score is selected to be used.

A variety of techniques can be used to score the candidate decodings. For example, the score may be derived from an analysis of how pixels or blocks of a particular candidate decoding fit in with other pixels of the image. Preferably the score is derived based upon a criteria indicative of error, such as a square error and correlation. For example, with respect to correlation, it is a fairly safe assumption that the adjacent pixels will be somewhat closely correlated. Thus, a significant or a lack of correlation is indicative that the candidate decoding is or is not the correct decoding.

As is shown in FIG. 6, four different criteria are analyzed to select the best candidate decoding. However, one, two, three or more different criteria can be analyzed to select the best candidate decoding. Referring to FIG. 6, the present embodiment utilizes four subscoring criteria which are subsequently combined into a final score. In particular, in step 615, the square error measure is generated; in step 620, horizontal correlation is determined; in step 625, vertical correlation is determined; and at step 630 temporal activity is measured. Each step utilizes an M-by-2·N matrix in accordance with M candidates, N blocks and 2 frames/block of data. Although horizontal and vertical correlation is discussed herein, it should be recognized that a variety of correlation measurements, including diagonal correlation, can be used.

At steps 635, 640, 645, 650, a confidence measure is generated for each criterion to normalize the measurements generated. At steps 655, 660, 665 and 670, a probability function for each of the different criteria is generated. These probability functions are then combined, for example, by multiplying the probability values to generate a score, for example, the likelihood function shown in FIG. 6, step 675. The score for the candidate decoding is subsequently compared against all candidate decoding scores to determine the likely candidate.

A variety of techniques can be used to evaluate the candidate decodings and generate the "scorings" for each candidate. For example, confidence measures are one way of normalizing the criteria. Furthermore, a variety of confidence measures, besides the ones described below, can be used. Similarly, multiplying the probability values based on each criterion to generate a total likelihood function is just one way of combining the variety of criteria examined.

The encoding processes facilitate the determination of the best candidate decoding because typically the candidate decodings which are not the likely candidate will have a relatively poor score, while decodings that are the likely candidate will have a significantly better score.

Figure 8C:
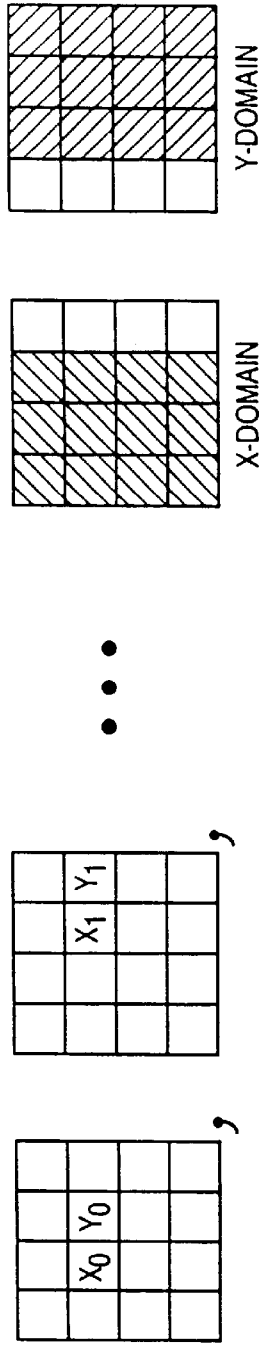
Figure 8D:
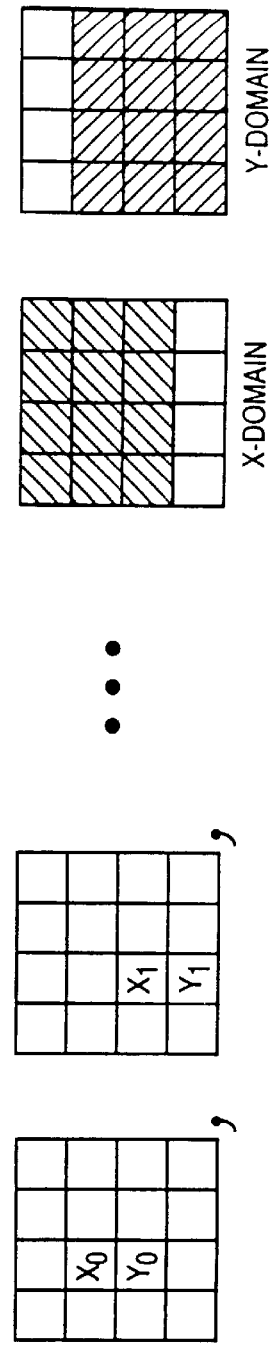

FIGS. 8a, 8b, 8c and 8d provide illustrations of the different measurements performed at steps 615, 620, 625 and 630 of FIG. 6 to generate the scoring and total score for a particular candidate decoding. FIG. 8a illustrates the square error to evaluate a candidate decoded pixel $x_i$ as compared to its decoded neighbors $y_{i,j}$, wherein the suffix "i,j" is corresponding to the neighboring address of "i". Optionally, some of the largest terms are removed to remove any influences due to spikes, that is the terms that arise due to legitimate edges in the image. For example, the three largest terms of $(x_i-y_{i,j})^2$ may be discarded to remove spikes.

FIG. 8b illustrates the temporal activity criteria. This is applicable only when it is or is assumed to be a motion block. The temporal activity criteria assumes that the better the candidate decoding, the smaller the differences between blocks. Thus the worse the candidate decoding, the larger the differences between blocks. Spatial correlation assumes that the more likely candidate decodings will result in heavy correlations as real images tend to change in a slow consistent way. The horizontal correlation process illustrated in FIG. 8c and vertical correlation process illustrated by FIG. 8d utilize that assumption.

The confidence measures, steps 635, 640, 645, and 650 of FIG. 6, provide a process for normalizing the criteria determined in the previous steps (steps 615, 620, 625 and 630). In one embodiment, for example, the confidence measure for the square error takes values from the interval [0,1], and confidence is equal to 0 if the errors are equal and equal to 1 if one error is 0. Other measures or methods to normalize are also contemplated.

Similarly, the confidence measure for the spatial correlation is:

$$\text{maximum}(Y,0)-\text{maximum}(X,0)$$

where Y is the best correlation value and X is the correlation for the current candidate decoding. The temporal activity confidence measure is determined according to the following equation:

$$\text{conf}=(a-b)/(a+b)$$

where a=max (X, M_TH) and b=max (Y,M_TH) where M_TH is the motion threshold for the candidate block and Y is the best measurement, that is the smallest temporal activity, and X equals the current candidate measurement of temporal activity.

At steps 655, 660, 665 and 670, FIG. 6, the probability function is generated for each of the different criteria. A variety of methods can be used to generate the probability measure. For example, a score can be prescribed to a confidence measure. If the confidence measure is greater than a predetermined value, e.g., 0.8, the base score is decreased by 10; if between 0.5 and 0.8, the base score decreased by 5.

FIG. 9 illustrates one embodiment in which a table used to generate the probability function for the square error measurement criteria. The table includes empirically determined data containing arbitrarily binned confidence and square error measures and known candidate decodings. More particularly, the table can be generated by using undamaged data and assuming that the DR was corrupted or lost. Keys and confidence measures for correct and incorrect decodings are then generated.

The table reflects the probability ratio of correct to incorrect decodings. Using this table, for a particular squared error value (row) and confidence value (column), the probability can be determined. For example, it can therefore be seen that for a variety of square error measures at a confidence measure of zero, there is approximately a 40% to 50% probability that the candidate is correct. If the confidence is not 0, but small, the probability drops significantly. Similar probability tables are generated for the correlation and temporal measurements based on corresponding empirically determined criteria measurements and confidence measurements.

The probabilities generated are considered data to generate "scores" in the present embodiment. Other techniques to score candidate decodings may also be used. At step 1875, the different probabilities are combined into a likelihood function $L_i = \pi_j \cdot P_{i,j}$, where $\pi_j$ is a multiplication function of probability functions $P_{i,j}$, and $P_{i,j}$ is the probability function for candidate i, block j. The candidate is therefore selected as the one that maximizes the function $L_i$.

Figure 10:
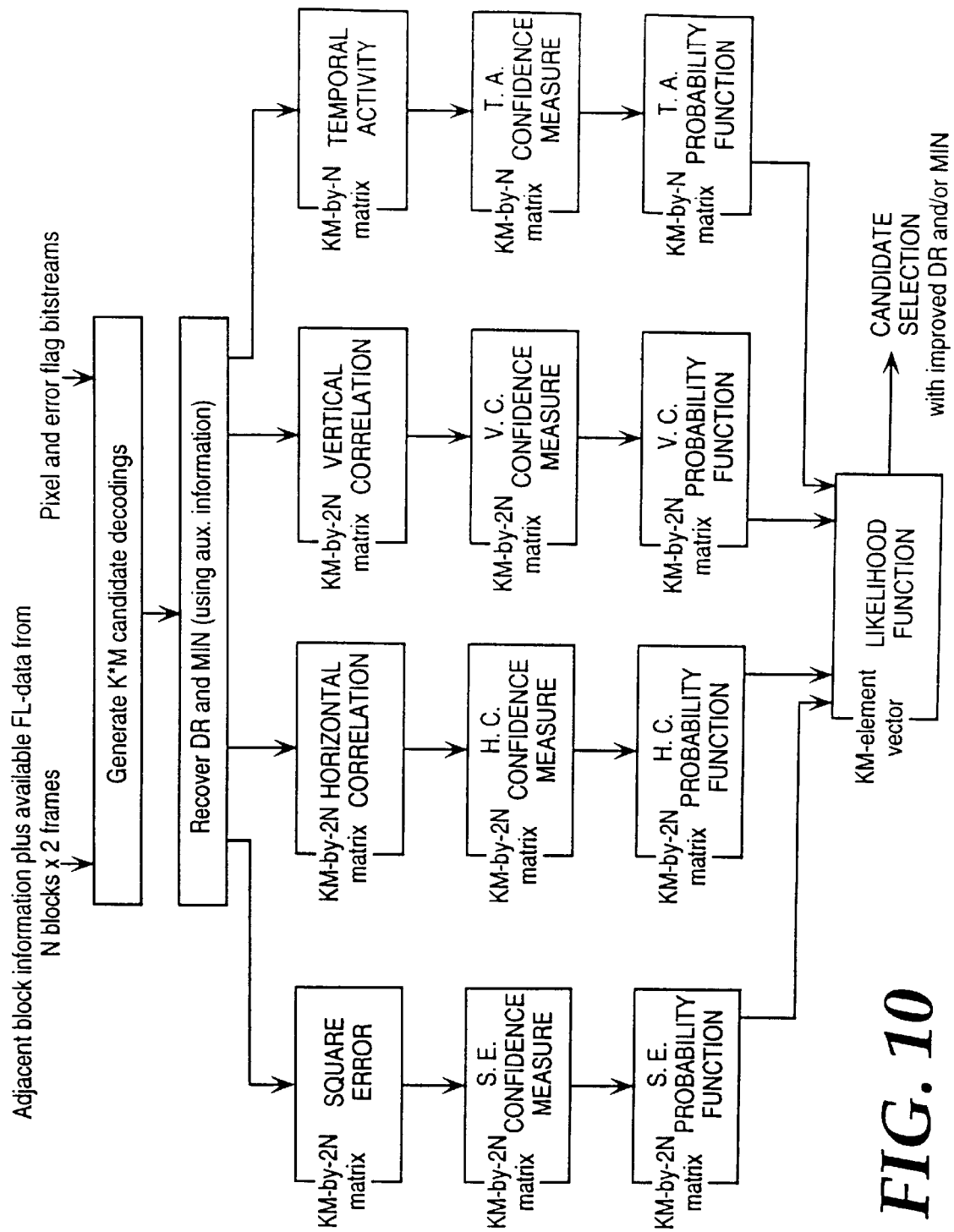
FIG. 10 illustrates one embodiment of a Qbit, Motion Flag and auxiliary information recovery process in accordance with one embodiment of the present invention.

Referring back to FIG. 6, it may be necessary to recover certain block attributes that were transmitted in lost packets. Therefore, at step 610, DR and MIN values are recovered where necessary. A variety of techniques, from default values, averaging, squared error functions to more sophisticated techniques, including those discussed in Kondo, Fujimori, Nakaya and Uchida, "A New Concealment Method for Digital VCRs", IEEE Visual Signal Processing and Communications, Sep. 20–22, 1993, Melbourne Australia, may be used. The recovered values are utilized to generate the candidate decodings as discussed above. Alternately, the DR and MIN values are determined during the Qbit determination process. This is illustrated in FIG. 10. In particular, as noted above, in the present embodiment, the Motion Flag and number of quantization bits are used in the encoding process and later used during the recovery process to narrow the number of possible candidate decodings. Other information can also be used. Thus the value of DR and/or value of MIN may also be used to encode the data. Alternately, a portion of bits of DR are used for encoding (e.g., the two least significant bits of DR). Although the DR data is encoded, the number of possible candidate decodings is increased significantly as variables are added. Referring to FIG. 10, K·M candidate decodings are therefore generated, where K is the number of candidate values for the unknown data, e.g. K=4 if two bits of the sum of $DR_1$, $DR_2$ and $DR_3$ is encoded ($DR_1$, $DR_2$ and $DR_3$ represent the DR values of the blocks of the group). The DR and MIN are therefore recovered using the auxiliary information provided, e.g., the encoded two bits of the sum of $DR_1$, $DR_2$ and $DR_3$. This improves the process of candidate selection at the cost of additional overhead to examine the larger number of candidate decodings.

It should be noted that generally, the more neighboring blocks that are decoded, the better the Qbit and Motion Flag recovery process. Furthermore, in some embodiments the process is applied to each subsequent block of a buffer; if all or some of the FL-data is available, the number of candidate decodings can be reduced, possibly to one candidate decoding given all the FL-data for a block is available. However, it is desirable that the Qbit and Motion Flag recovery process be avoided altogether as the process is a relatively time consuming one. Furthermore, it is desirable to use as much information as possible to perform Qbit and Motion Flag recovery.

In one embodiment, blocks are processed from the beginning of a buffer until a block with lost Qbit/Motion Flag information is reached. This is referred to as forward Qbit and Motion Flag recovery. In another embodiment, the end of the buffer is referenced to determine the location of the end of the last block of the buffer and the data is recovered from the end of the buffer until a block with lost Qbit/Motion Flag data is reached. This is referred to as backward Qbit and Motion Flag recovery.

As noted earlier, the blocks are variable in length, due the length of the VL-data; therefore there is a need to determine the number of bits forming the VL-data of a block so that the position of subsequent blocks in the buffer can be accurately located. During the encoding process, a post-amble of a predetermined and preferably easily recognizable pattern is placed in the buffer to fill the unused bit locations. During the decoding process, the post-amble will be located between the block and the end of the buffer. As the pattern is one that is easily recognizable, review of patterns of bits enables the system to locate the beginning of the post-amble and therefore the end of the last block in the buffer.

This information can be used in two ways. If the last block contains damaged Qbit/Motion Flag data and the beginning of the last block is known (e.g., the preceding blocks have been successfully decoded), the difference between the end of the immediate preceding block and the beginning of the post-amble corresponds to the length of the block. This information can be used to calculate the Qbit and/or Motion Flag of the block. The starting location of the post-amble can also be used to perform Qbit and Motion Flag recovery starting at the last block and proceeding towards the beginning of the buffer. Thus, the Qbit and Motion Flag recovery process can be implemented bidirectionally.

Figure 11:
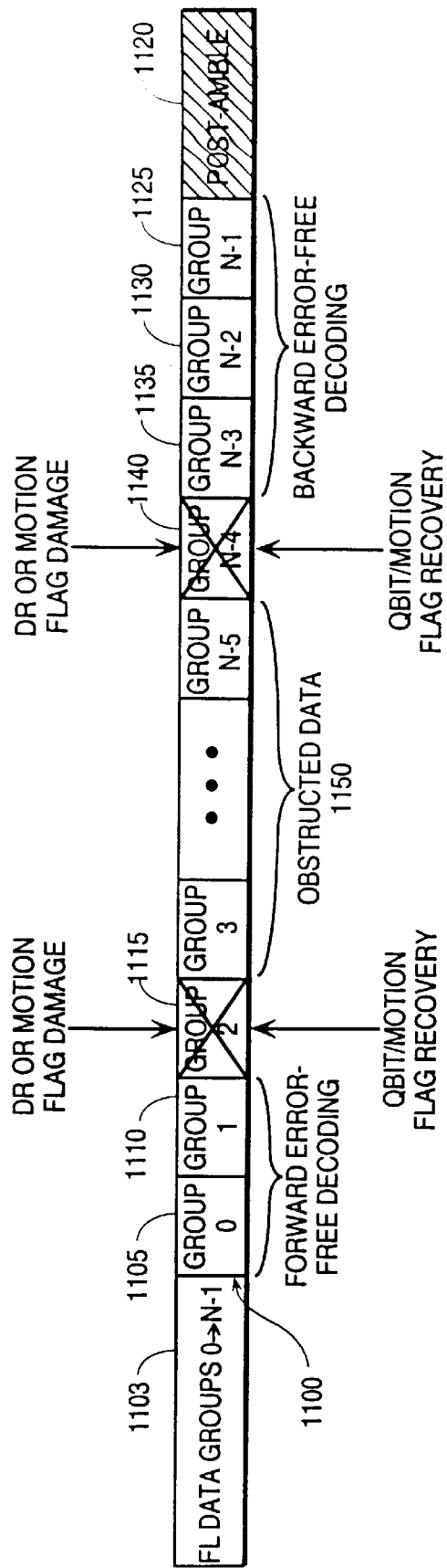
FIG. 11 illustrates the use of a post-amble in one embodiment of a bidirectional Qbit and Motion Flag recovery process.

FIG. 11 illustrates the use of a post-amble in the bidirectional Qbit and Motion Flag recovery process. Referring to FIG. 11, the buffer 1100 includes FL-data 1103 for the N groups of blocks of VL-data. Each group consists of a plurality of blocks (e.g., 3 blocks). In the present example, the first two groups 1105, 1110 are decoded and the third group 1115 cannot immediately be decoded due to damaged DR/Motion Flag data. At this point, the Qbit/Motion Flag recovery process is required in order to recover the damaged data. Rather than continue processing groups in the forward direction, the process refers to the end of the buffer, determined by looking for the post-amble pattern 1120. The beginning of the post-amble and therefore the end of the last group of blocks are determined. As the DR/Motion Flag data is indicative of the length of the VL-data, the beginning of the VL data of the last block, and therefore the end of the immediate preceding block, is determined. Therefore, the blocks can be decoded, e.g., blocks 1125, 1130, 1135 until a block 1140 with damaged data is reached. The damaged 1115,1140 and obstructed blocks 1150 are then recovered, for example, using the Qbit/Motion Flag recovery process described above.

The bidirectional process is not limited to a sequence of forward and reverse processing; processing can occur in either or both directions. Furthermore, in some embodiments, it may be desirable to perform such processing in parallel to improve efficiency. Finally, it is contemplated that undamaged obstructed blocks may be recovered by directly accessing the Qbit/Motion Flag information without executing the Qbit/Motion Flag recovery process described above.

As noted earlier, a variety of scoring techniques may be used to determine the best candidate decoding to select as the decoding. In an alternate embodiment, the smoothness of the image using each candidate decoding is evaluated. In one embodiment, the Laplacian measurement is performed. The Laplacian measurement measures a second-order image surface property, e.g., surface curvature. For a linear image surface, i.e., smooth surface, the Laplacian measurement will result in a value that is approximately zero.

Figures 12A, 12B:
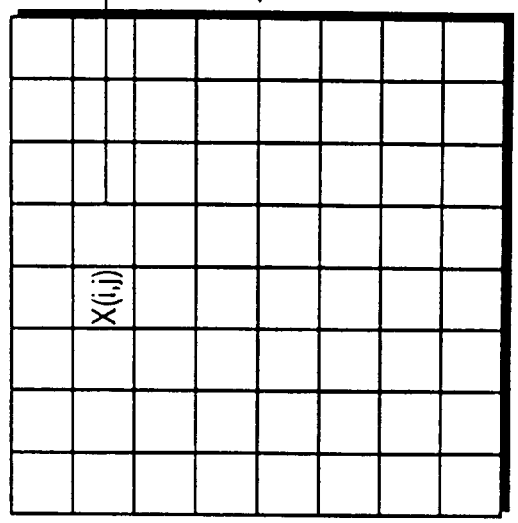
FIGS. 12a, 12b and 12c illustrate an alternate embodiment for evaluating candidate decodings.
Figure 12C:
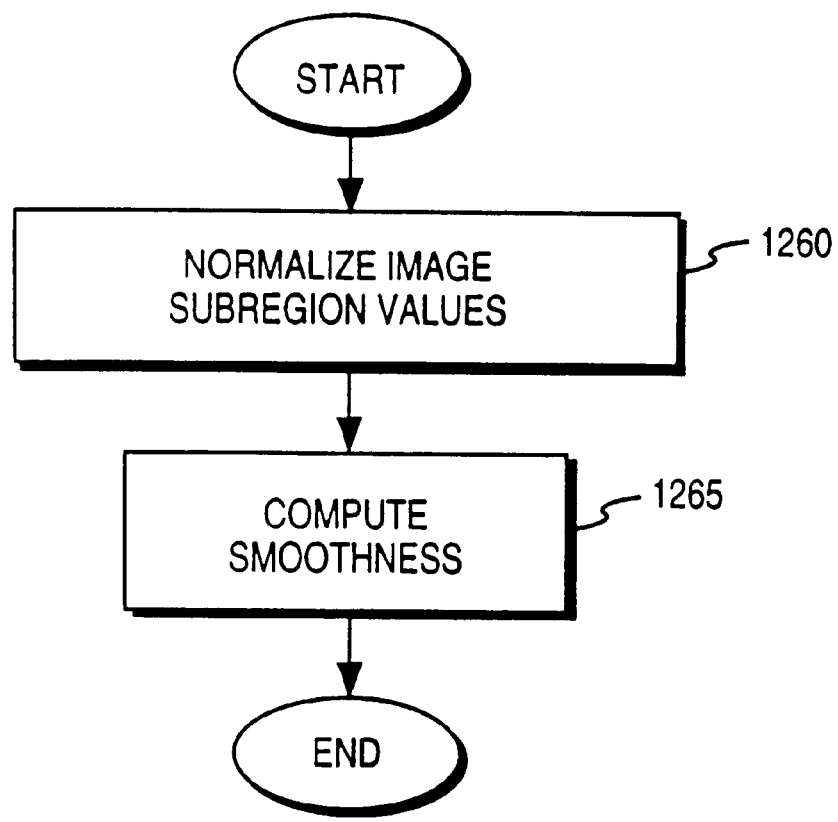

The process will be explained with reference to FIGS. 12a, 12b, and 12c. FIG. 12a illustrates one embodiment of the Laplacian kernel. It is contemplated that other embodiments may also be used. The kernel "L" represents a 3×3 region. To measure smoothness of the image region, 3×3 subregions of the image (FIG. 12b) are convolved with the kernel and the convolved values are averaged. The size of the region and subregion (and therefore kernel size) can be varied according to application.

One embodiment of the process is described with reference to FIG. 12c. This embodiment utilizes a kernel and subregion size of 3×3 and a region size of 8×8, the individual elements identified by indices i,j. At step 1260, the candidate decoded values x[i][j] are normalized. For example, the values can be normalized according to the following equation:

$$x'[i][j] = \frac{x[i][j]}{\sqrt{\sum_{i,j}(x[i][j] - X_{mean})^2}}, 0 \le i, j < 8$$

where, $$X_{mean} = \frac{\sum_{i,j} x[i][j]}{64}, 0 \le i, j < 8$$

At step 1265, the normalized values are used to compute a block Laplacian value $L_x$ indicative of smoothness according to the following:

$$l[i][j] = \sum_{m=-1}^{1} \sum_{n=-1}^{1} L[m][n] \cdot x'[i+m][j+n], 0 \le i, j < 8$$

$$L_x = \frac{\sum_{i,j} |l[i][j]|}{64}$$

The closer the block Laplacian value is to zero, the smoother the image portion. Thus a score can be measured based upon the block Laplacian value, and the decoding with the least Laplacian value is the correct one.

The Laplacian evaluation can also be achieved using candidate encoded values q[i][j]. The basic process is the same as the candidate decoded value case of FIG. 12c. This embodiment utilizes a kernel and subregion size of 3×3 and a region size 8×8, the individual elements identifies by the indices i,j. At step 1260, the candidate encoded values q[i][j] are normalized. For example, the values can be normalized according to the following equation:

$$q'[i][j] = \frac{q[i][j]}{\sqrt{\sum_{i,j}(q[i][j] - Q_{mean})^2}}, 0 \le i, j < 8$$

where, $Q_{mean} = \dfrac{\sum_{i,j} q[i][j]}{64}$

At step 1265, the normalized values are used to compute the block Laplacian value $L_q$ indicative of smoothness according to the following equation:

$$l[i][j] = \sum_{m=-1}^{1} \sum_{n=-1}^{1} L[m][n] \cdot q'[i+m][j+n], 1 \le i, j < 7$$

$$L_q = \frac{\sum_{i,j} |l[i][j]|}{36}$$

The closer the block Laplacian value is to zero, the smoother the image portion. Thus a score can be measured based upon the block Laplacian value and the candidate with the smallest Laplacian value is the correct one.

Other variations are also contemplated. In alternative embodiments, higher order image surface properties can be used as a smoothness measure. In those cases, higher order kernels would be used. For example, a fourth order block Laplacian measurement may be performed using a fourth order kernel. Such a fourth order kernel can be realized using two second order Laplacian computations in cascade.

Figure 13:
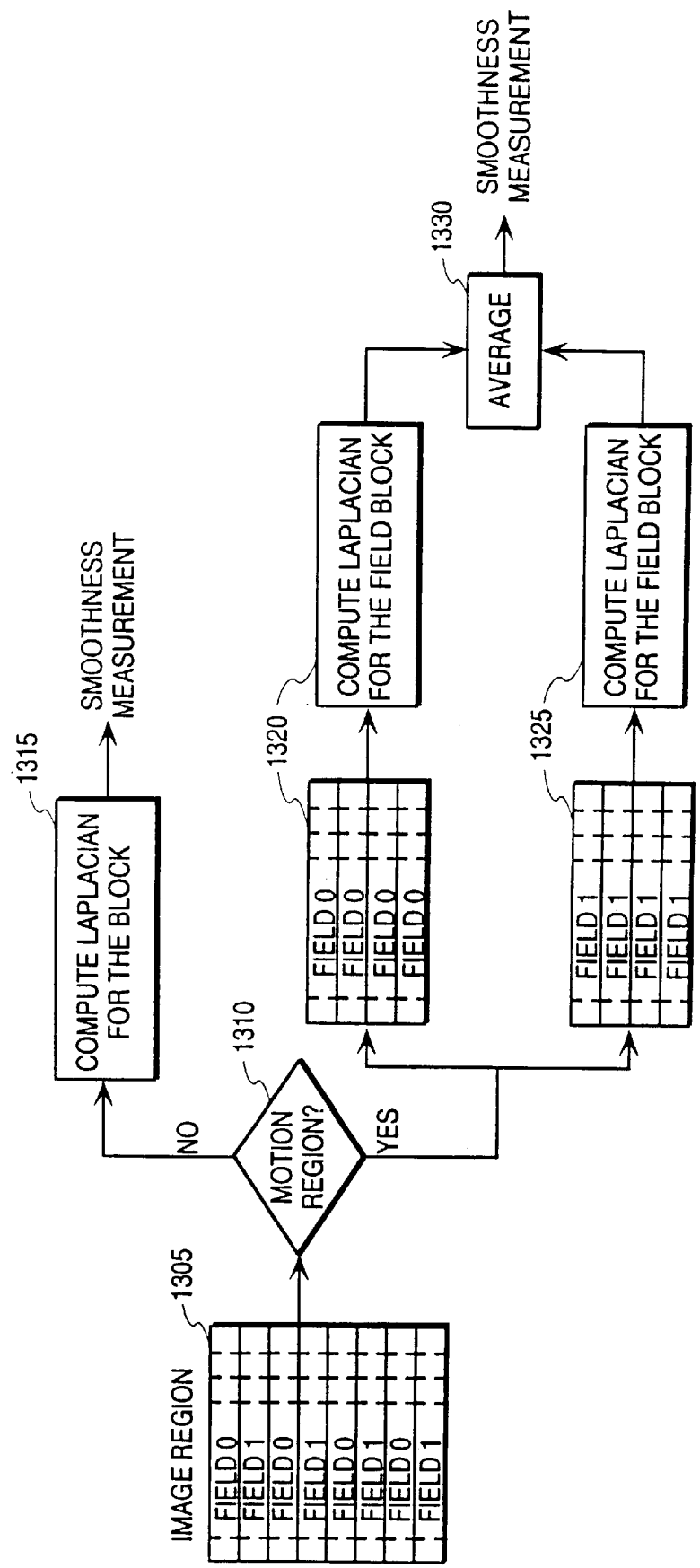
FIG. 13 illustrates the use of smoothness measures in accordance with the teachings of one embodiment of the present invention.

The evaluation process can be dependent upon whether the image has an activity or motion larger than a predetermined level. If the image portion is evaluated to have larger motion than a predetermined level, then it may be preferable to perform the measurements on a field basis as opposed to on a frame basis. This is explained with reference to FIG. 13. FIG. 13 explains the process using smoothness measures; however, it is contemplated that this process can be implemented using a variety of types of measures.

Frame 1305 of an image region is composed of field 0 and field 1. If motion is not detected, step 1310, the smoothness measurement is computed by computing the block Laplacian value for the block within each frame, step 1315. If larger motion than a predetermined level is detected, block Laplacian measurements are performed on each field, steps 1320, 1325, and the two measurements are combined, step 1330, e.g. averaged, to generate the smoothness measurement.

Motion can be detected/measured a variety of ways. In one embodiment, the extent of change between fields is evaluated and motion is detected if it exceeds a predetermined threshold.

Motion detection and the use of frame information and field information to generate recovered values (typically to replace lost or damaged values) can be applied to any portion of the process that requires a recovered value to be generated. For example, motion detection and the selective use of frame information and field information to generate recovered values can be applied to DR/MIN recovery, pixel recovery as well as Qbit and Motion Flag recovery processes. Thus, based on the level of motion detected, the recovery process will utilize existing information on a field basis or frame basis. Furthermore, this process can be combined with the application of weighting values that are selected based upon levels of correlation in particular directions (e.g., horizontal or vertical).

Figure 14B:
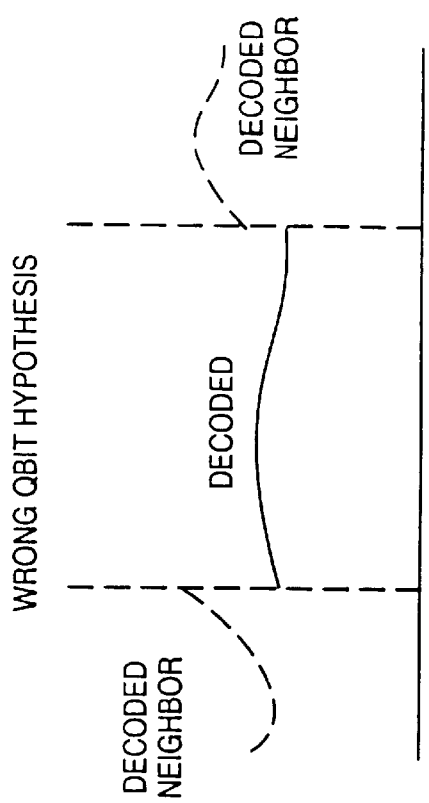
FIGS. 14a, 14b, 14c, 14d and 14e illustrate an alternate embodiment of a process for evaluating candidate decodings.
Figure 14A:
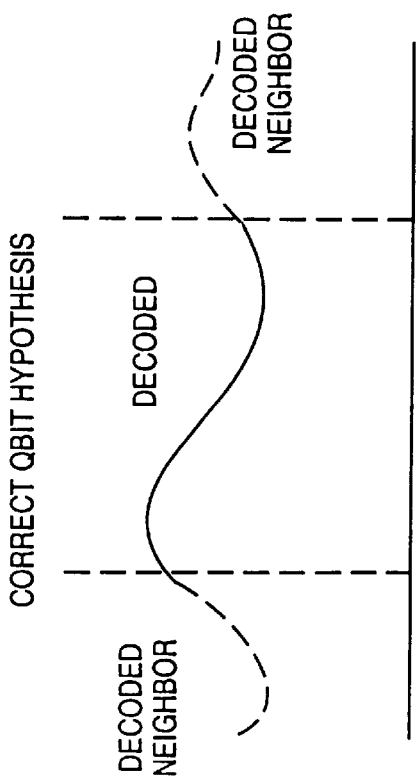

In another embodiment of the Qbit and Motion Flag recovery process, candidate decodings are evaluated based upon intra block and inter block measurements. In the following discussion, the term "block" refers to a portion of a frame or field. The intra block measurement evaluates the candidate decoded image portion, e.g., the smoothness of the image portion. The inter block measurement measures how well the candidate decoding fits with the neighboring image portions. FIGS. 14a and 14b illustrate the combined inter block and intra block evaluation. In particular, FIG. 14a shows an acceptable candidate decoding as both the inter block and intra block measurements are good, whereas in FIG. 14b the inter block measurement is poor, even though the intra block measurement is quite good.

Examples of intra block measurements include the smoothness measurement described above. Examples of inter block measurements include the square error measurements described earlier. An alternative inter block measurement is the ratio of compatible boundary pixels and the total number of boundary pixels at the candidate ADRC block.

Figure 14C:
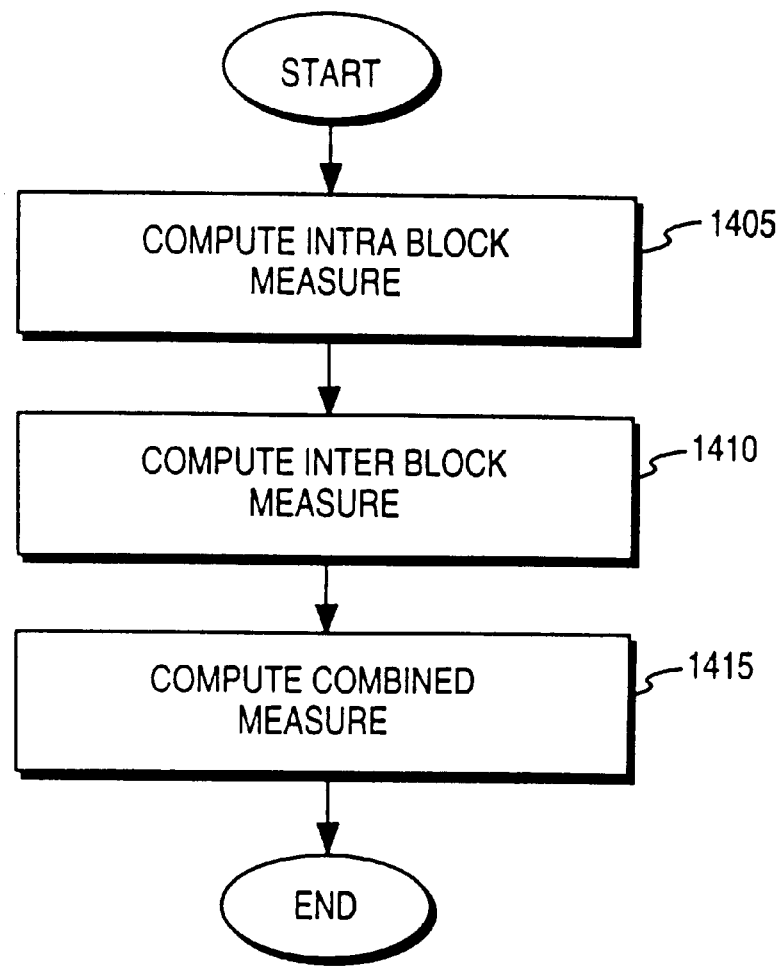

An example of an inter block and intra block evaluation of an 8×8 block that is ADRC encoded will be explained with respect to FIGS. 14c, 14d and 14e. FIG. 14d illustrates an image portion (block) of data of a encoded values 1450 consisting of q values from which candidate decoded values x are generated and neighboring decoded data 1455 consisting of y values. As set forth in the flow chart of FIG. 14c, at step 1405, the intra block measure is computed to generate a measure, e.g., block Laplacian $L_x$. At step 1410, the inter block measure $S_x$ is computed to generate a measure of compatibility between adjacent blocks. At step 1415, the combined measure $M_x$ is generated. The combined measure provides the information used to select a candidate decoding.

Figure 14E:
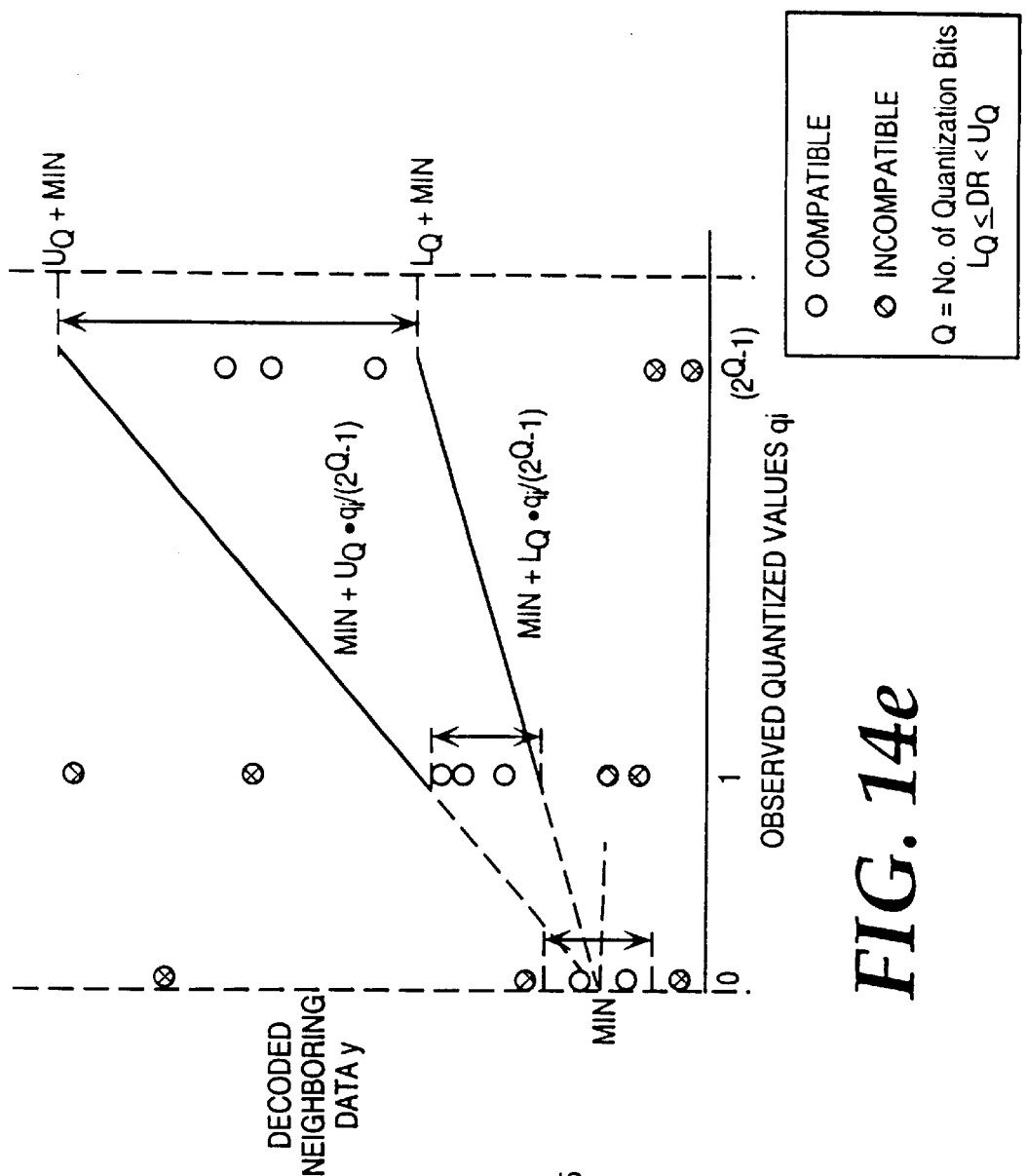
Figure 14D:
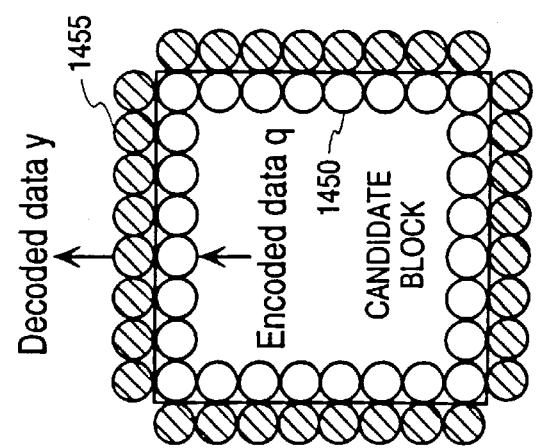

In the present embodiment, $S_x$ is computed as the number of neighboring data that lies in a valid range for each boundary pixel of candidate decoding (see FIG. 14e). FIG. 14e is a chart illustrating a valid range for one embodiment which shows a valid range of each observed quantized value $q_i$. Thus $L_Q \leq DR < U_Q$, where $L_Q$, $U_Q$ respectively represent the lower and upper bounds of DR corresponding to the number of quantization bits=Q. Preferably $S_x$ is normalized according to the following: $S_x = S_x$/number of boundary pixels.

In the present embodiment the combined measure $M_x$ is computed according to the following equation: $M_x = S_x + (1 - L_x)$. Alternatively, the combined measure may be weighted such that the following equation would be used: $M_x = w \cdot S_x + (1-w) \cdot (1-L_x)$, where w is the weighting value, typically an empirically determined weighting value.

Other embodiments for determining DR and MIN values that have been lost/damaged are also contemplated. For example, the earlier described equations can be modified to recover DR and MIN values with higher accuracy. In an alternate embodiment, a median technique is applied. In one embodiment of the median technique, the value of MIN is recovered as the median of all $MIN_i$ values computed as:

$$MIN_i = y_i - q_i \cdot s$$

where $q_i$ represents the encoded pixel value and $y_i$ represents the decoded pixel neighboring $q_i$. For edge-matching ADRC, $s=DR/(2^Q-1)$. For non-edge-matching ADRC, $s=DR/2^Q$, where Q represents the number of quantization bits per pixel (Qbit value).

The values used may be temporally proximate or spatially proximate. The values of $y_i$ may be the decoded value of the neighboring pixel in an adjacent frame/field or the same field. The values of $y_i$ may be the decoded value of the pixel from the same location as $q_i$ in an adjacent frame/field or the same field.

In addition, any DR and/or MIN recovery technique may be combined with a clipping process to improve recovery accuracy and prevent data overflow during the recovery process. The clipping process restricts the recovered data to a predetermined range of values; thus those values outside the range are clipped to the closest range bound. In one embodiment, the clipping process restricts values in the range $[L_Q, U_Q]$, where $L_Q$, $U_Q$ respectively represent the lower and upper bounds of the range of pixel values represented by the number of quantization bits Q. The values can be further restricted to MIN+DR≦Num, where Num represents the minimum pixel value; in the present embodiment, Num is 255. Furthermore, in the present embodiment, where applicable, $U_Q+1=L_{Q+1}$.

Combining the criteria into a single equation results for an unbounded recovered value (val') for the DR, the final clipped recovered value (val) is obtained from the following equation:

$$val = max(min(val, min(U_Q, 255-MIN)), L_Q)$$

where min and max respectively represent minimum and maximum functions.

In an alternate embodiment, the boundary pixels $y_i$ used to generate an recovered DR and/or MIN can be filtered to only use those that appear to correlate best, thereby better recovering DR and MIN. Those boundary pixels not meeting the criteria are not used. In one embodiment, a boundary pixel $y_i$ is considered valid for DR calculations if there exists a value of DR such that $L_Q \leq DR < U_Q$ and an original pixel $y_i$ would have been encoded as $q_i$. Thus, a pixel is valid if the following equations are satisfied:

$$\frac{(y_i - MIN) \cdot m}{\max(q_i - 0.5, 0)} \geq L_Q$$

$$\frac{(y_i - MIN) \cdot m}{\min(q_i - 0.5, m)} < U_Q$$

where m represents the maximum quantization level=$2^Q-1$. A DR recovered value (val') can then be computed according to the following equation:

$$val' = \frac{m \cdot \sum_i (y_i - MIN) \cdot q_i}{\sum_i q_i^2}$$

The value can then be clipped into the valid range. Thus this process forces the DR recovered value into the interior of the valid region as defined by the threshold table, reducing the accuracy for points whose true DR lies near the threshold table boundary.

Due to quantization noise, the DR of stationary ADRC blocks varies slightly from frame to frame. If this variance crosses an ADRC encoding boundary, and if the DR is recovered on several consecutive frames, then the DR recovered value with valid pixel selection tends to overshoot at each crossing, resulting in a noticeable blinking effect in the display. In an attempt to reduce the occurrence of this effect, in one embodiment, the valid pixel selection process is modified to relax the upper and lower bounds, allowing border pixels that encroach into the neighboring valid region. By including points just outside the boundary, it is more likely that the recovered value will take on a value near that of the upper or lower bound. The relaxed bounds $L'_Q$ and $U'_Q$ are computed by means of a relaxation constant r.

In one embodiment, r is set to a value of 0.5. Other values can be used:

$$L'_Q = rL_{Q-1} + (1-r)L_Q$$

$$U'_Q = (1-r)U_Q + rU_{Q+1}$$

The discussion above sets forth a number of ways to recover DR and MIN when the values have been damaged or lost. Further enhancements can be realized by examining the correlation between data temporally and/or spatially, and weighting corresponding calculated recovered values accordingly. More particularly, if there is a large correlation in a particular direction or across time, e.g., horizontal correlation, there is a strong likelihood that the image features continue smoothly in that direction that has a large correlation and therefore an recovered value using highly correlated data typically generates a better estimate. To take advantage of this, boundary data is broken down into corresponding directions (e.g., vertical, horizontal, field-to-field) and weighted according to the correlation measurement to generate a final recovered value.

Figure 15A:
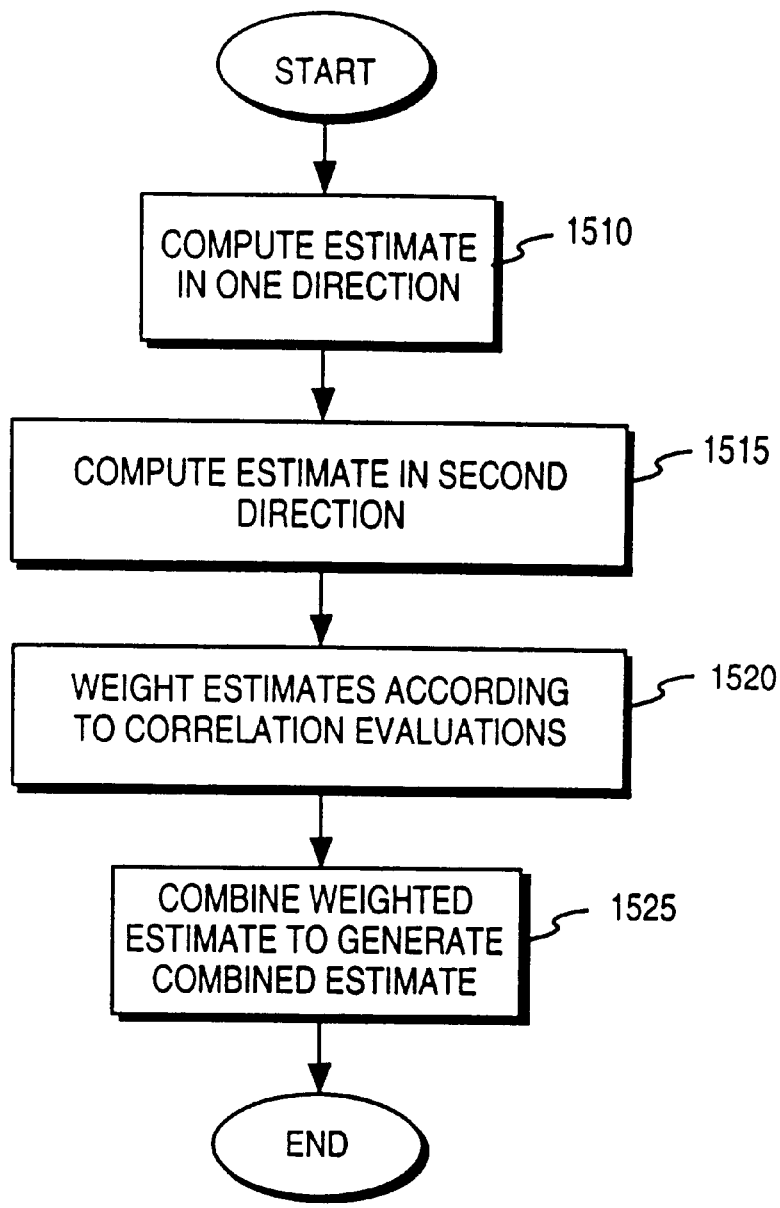
FIG. 15a illustrates an alternate process for evaluating candidate decodings and FIG. 15b illustrates one embodiment for determining weighting values.

One embodiment of the process is described with reference to FIG. 15a. At step 1510, a recovered value of the DR or MIN value to be recovered is generated in one direction and at step 1515, a recovered value is generated in another direction. For example, if the process is spatially adaptive, then boundary pixels along horizontal borders are used to generate a first recovered value, "hest", and boundary pixels along vertical borders are used to generated a second recovered value, "vest". Alternately, if the process is temporally adaptive, then boundary pixels between adjacent fields are used to generate a first recovered value and boundary pixels between adjacent frames are used to generate a second recovered value.

At step 1520, the recovered values are weighted according to correlation calculations indicative of the level of correlation in each direction. The weighted first and second recovered values are combined to generate a combined recovered value, step 1525. The process is not limited to generated weighted recovered values in only two directions; the number of recovered values that are weighted and combined can be varied according to the application.

A variety of known techniques can be used to generate a correlation value indicative of the level of correlation in a particular direction. Furthermore, a variety of criteria can be used to select the weighting factor in view of the levels of correlation. Typically, if one correlation is much larger than the other, the combined recovered value should be based primarily on the corresponding recovered value. In one embodiment, the combined recovered value is computed as follows:

$$val' = \begin{cases} \alpha hest + (1-\alpha)vest : & hc \geq vc \\ (1-\alpha)hest + \alpha vest : & hc < vc \end{cases}$$

where hc represents the horizontal correlation, vc represents the vertical correlation, hest represents a DR recovered value based only on left and right boundary information, and vest represents a DR recovered value based only on top and bottom boundary information, and a represents the weighting value.

Figure 15B:
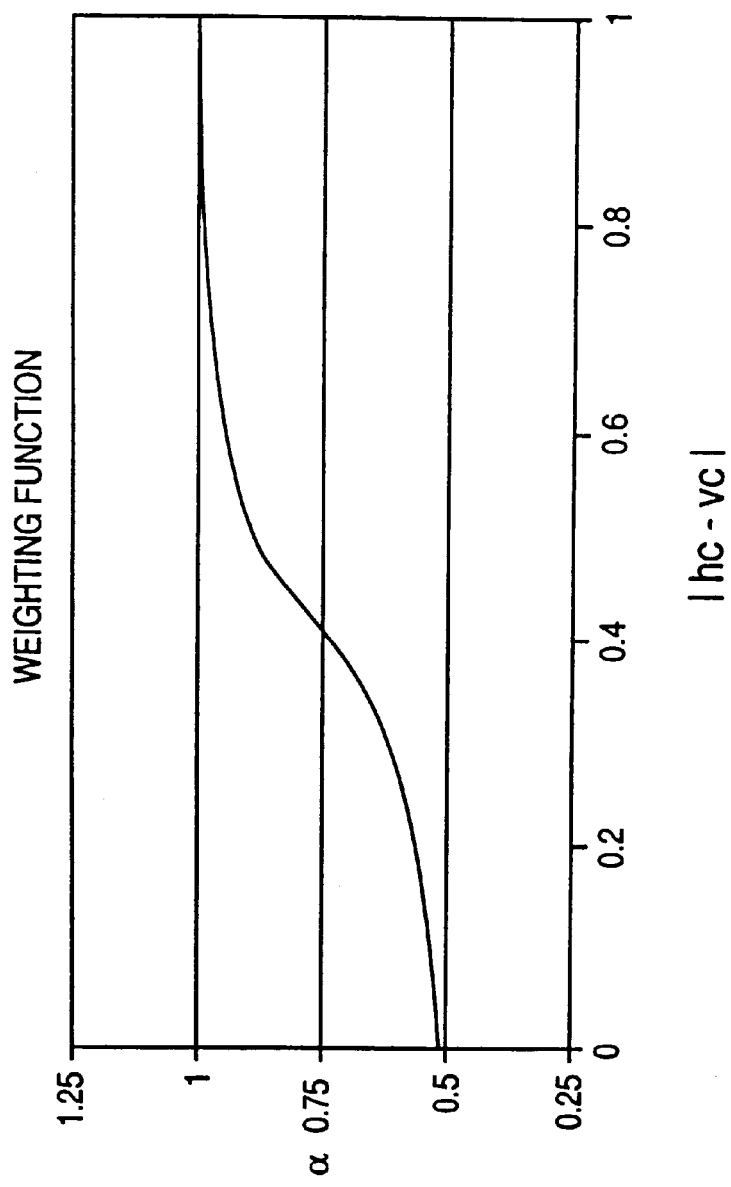

The weighting value can be determined a variety of ways. FIG. 15b illustrates one embodiment for determining weighting values as a function of the difference between the horizontal correlation and vertical correlation. More particularly, a was chosen to be:

$$\alpha(|hc - vc|) = \begin{cases} 0.5 + 0.25 \cdot e^{-8(0.35 - |hc - vc|)} : & |hc - vc| < 0.35 \\ 1 - 0.25 \cdot e^{-8(|hc - vc| - 0.35)} : & |hc - vc| \geq 0.35 \end{cases}$$

As noted above, the adaptive correlation process is applicable to both DR and MIN recovery. It is preferred, however, that the MIN recovery is clipped to insure that MIN+DR≦255, therefore the function val=max(min(val',255−MIN), 0) can be used. Furthermore, as noted above, the temporal correlation can be evaluated and used to weight recovered values. In addition, a combination of temporal and spatial correlation can be performed. For example, one recovered value is generated between fields as a temporal recovered value. Another recovered value is generated within one field as a spatial recovered value. The final recovered value is computed as the combination value with a combination of temporal and spatial correlation. The correlation combination can be replaced with a motion quantity. Other variations are also contemplated. For example, the techniques described herein can be applied to audio data.

In an alternate embodiment, a low complexity modification to the least squares technique is used. Using this embodiment, the blinking experienced due to recovered DR values is reduced. For purposes of the following discussion, QV represents a list of encoded values from the image section or ADRC block whose DR is being recovered having a set of points $q_i$ and Y is a list of decoded values taken from the vertical or horizontal neighbors of the points in QV, where $y_i$ represents a vertical or horizontal neighbor of $q_i$. As each point $q_i$ may have up to four decoded neighbors, one pixel or point may give rise to as many as four ($q_i$, $y_i$) pairings. The unconstrained least squares estimate of DR ($DR_{uls}$) is thus:

$$(DR)_{uls} = \frac{2^Q \cdot \sum_i (y_i - MIN) \cdot (0.5 + q_i)}{\sum_i (0.5 + q_i)^2}$$

where Q is the number of quantization bits, MIN is the minimum value transmitted as a block attribute. The above equation assumes non-edge-matching ADRC; for edge-matching ADRC, $2^Q$ is replaced with $2^Q-1$ and $(0.5+q_i)$ is replaced with $q_i$.

The unconstrained least squares estimate is can be clipped to assure consistency with the threshold table and the equation MIN+DR≦255 which is enforced during encoding (Typically, for non-edge-matching ADRC, permissible DR values are in the range of 1–256). Thus, the least squares estimate is clipped ($DR_{lsc}$) by:

$$(DR)_{lsc} = \max(\min(UB, DR_{uls}), LB)$$

where UB represents the upper bound and LB represents the lower bound and min and max respectively represent minimum and maximum functions.

In an alternate embodiment, the estimation can be enhanced by selecting the pixels that are more suitable for DR estimation to calculate the estimate of DR. For example, flat regions in an image provide pixels which are more suitable for DR estimation than those regions in which high activity occurs. In particular, a sharp edge in the edge may decrease the accuracy of the estimate. The following embodiment provides a computationally light method for selecting the pixels to use to calculate an estimate of DR.

In one embodiment, the least squares estimate ($DR_{lse}$), e.g., $DR_{uls}$ or $DR_{lsc}$, is computed. Using this estimate, the list of encoded values QV is transformed into candidate decoded values X, where $x_i$ are members of X derived from $q_i$. The $x_i$ value is a recovered decoded value formed using the first estimate of DR. The $x_i$ value is defined according to the following equation:

$$\text{Edge-matching ADRC: } x_i = MIN + \left(0.5 + \frac{q_i \cdot DR_{lse}}{2^Q - 1}\right)$$

$$\text{Non-edge-matching ADRC: } x_i = MIN + \left(\frac{(q_i + 0.5) \cdot DR_{lse}}{2^Q}\right)$$

Assuming $DR_{lse}$ is a reasonable estimate of the true DR, then anywhere that $x_i$ is relatively close to $y_i$, may be judged to be a low activity area and thus a desirable matching. New X and Y lists may then be formed by considering only the matches where $x_i$ and $y_i$ are close and the least squares estimate recomputed to generate an updated estimate.

The criteria for determining what is considered "close" can be determined a number of ways. In one embodiment, an ADRC encoding of the error function is used. This approach is desirable as it is computationally inexpensive. For the process, a list E, consisting of the points $e_i=|y_i-x_i|$ is defined. Defining emin and emax as respectively the smallest and largest values from the list, then eDR=emax−emin. An encoded error value can then defined as:

$$g_i=(e_i-emin)nl/eDR$$

where nl represents the number of quantization levels for requantizing $e_i$ in a similar manner to the ADRC process described above.

Thus, new lists X and Y are generated by selecting only those matches where $g_i$ is less than some threshold. If the new lists are sufficiently long, these lists may be used to generate a refined least squares estimate $DR_{rls}$. The threshold for $g_i$ and the number of matches needed before refining the least squares estimation is preferably empirically determined. For example, in one embodiment for an process involving 8×8×2 horizontally subsampled blocks and where nl is 10, only matches corresponding to $g_i=0$ are used and the estimate is refined only when the new lists contain at least 30 matches.

In an alternate embodiment, DR estimation can be improved by clipping potential DR values and recomputing a DR estimate. In particular, in one embodiment, a list D is composed of member $d_i$ which contains the DR value that would cause $x_i$ to equal $y_i$. More precisely:

$$d_i 2^Q(y_i-MIN)/(0.5+q_i)$$

Improvement is seen by clipping each $d_i$. That is, $$d_i'=\max(\min(UB,d_i),LB)$$

where $DR_{cls}$ is then computed to be the average of $d_i'$. The clipped method ($DR_{cls}$) may be combined with other DR estimates, e.g., $DR_{lse}$ in a weighted average to produce a final DR value. For example, the weighted average $DR_{est}$ is determined according to the following:

$$DR_{est}=w_1(DR_{cls})+w_2(DR_{lse}).$$

The weights $w_1$ and $W_2$ are preferably empirically determined by examining resultant estimations and images generated therefrom from particular weightings. In one embodiment $w_1=0.22513$ and $w_2=0.80739$.

The invention has been described in conjunction with the preferred embodiment. It is evident that numerous alternatives, modifications, variations and uses will be apparent to those skilled in the art in light of the foregoing description.

What is claimed is:

1. A method for recovering compression constants in a bitstream of encoded data, wherein the encoded data comprises image data having blocks and each block comprises compression constants selected from the group comprising MS, DR, CEN and MAX, wherein MIN represents a minimum data value in the block, DR represents a dynamic range of the block, CEN represents a central value and MAX represents a maximum data value in the block, the method comprising the steps of:

computing a numerator of a quotient determinative of the compression constant to be recovered;

computing a denominator of the quotient;

shifting off a least significant bit from the numerator and the denominator until the numerator and denominator are less than $2^K$; and performing K-bit division, where K is a constant.

2. The method as set forth in claim 1, wherein the encoded data is selected from the set comprising image data and sound data.

3. The method as set forth in claim 1, wherein the compression constant to be recovered is MIN and the quotient is selected from the group comprising:

Edge-matching ADRC:

$$MIN' = \frac{1}{N} \cdot \sum_{i=1}^{N}\left[y_i - 0.5 - \left(\frac{DR}{2^Q-1}\right) \cdot e_i\right]$$

Non edge-matching ADRC:

$$MIN' = \frac{1}{N} \cdot \sum_{i=1}^{N}\left[y_i - \frac{DR}{2^Q} \cdot (e_i + 0.5)\right]$$

where MIN' is the recovered MIN value, N represents a number of neighboring data to use, Q represents a number of quantization bits used to encode, $e_i$ represents encoded data of the block, $y_i$ represents decoded neighboring data and DR represents the dynamic range of the block.

4. The method as set forth in claim 1, wherein the compression constant to be recovered is CEN and the quotient is selected from the group comprising:

Edge-matching:

$$CEN' = \frac{1}{N} \cdot \sum_{i=1}^{N}\left[y_i - 0.5 - \left(\frac{DR}{2^Q-1}\right) \cdot e_i\right] + \frac{DR}{2}$$

Non edge-matching:

$$CEN' = \frac{1}{N} \cdot \sum_{i=1}^{N}\left[y_i - \frac{DR}{2^Q} \cdot (e_i + 0.5)\right] + \frac{DR}{2}$$

where CEN' is the recovered CEN value, N represents a number of neighboring data to use, Q represents a number of quantization bits used to encode, $e_i$ represents encoded data of the block, $e_i$ represents decoded neighboring data and DR represents the dynamic range of the block.

5. The method as set forth in claim 1, wherein the compression constant is DR and the quotient is selected from the group comprising:

Edge-matching ADRC:

$$DR' = \frac{(2^Q - 1) \cdot \sum_{i=1}^{N}(y_i - 0.5 - \text{MIN}) \cdot e_i}{\sum_{i=1}^{N} e_i^2}$$

$$DR' = \frac{(2^Q - 1) \cdot \sum_{i=1}^{N}(y_i - 0.5 - \text{MIN})}{\sum_{i=1}^{N} e_i}$$

Non edge-matching ADRC:

$$DR' = \frac{2^Q \cdot \sum_{i=1}^{N}(y_i - \text{MIN}) \cdot (e_i + 0.5)}{\sum_{i=1}^{N}(e_i + 0.5)^2}$$

$$DR' = \frac{2^Q \cdot \sum_{i=1}^{N}(y_i - \text{MIN})}{\sum_{i=1}^{N}(e_i + 0.5)}$$

where DR' is the recovered DR value, N represents a number of neighboring data to use, Q represents a number of quantization bits used to encode, $q_i$ represents encoded data of the block, $y_i$ represents decoded data of neighboring data and MIN represents a minimum data value in the block.

6. A system for recovering at least one lost/damaged compression constant for encoded data, wherein the encoded data comprises image data and each block comprises compression constants selected from the group comprising MIN, DR, CEN and MAX compression constants, wherein MIN represents a minimum data value in the block, DR represents a dynamic range of the block, CEN represents a central value and MAX represents a maximum data value in the block, the method comprising numerator logic configured to compute a numerator of a quotient determinative of the compression constant to be recovered;

denominator logic configured to compute a denominator of the quotient;

shift logic configured to shift off a least significant bit from the numerator and the denominator until the numerator and the denominator are less than $2^K$; and computation logic configured to perform K-bit division, where K is a constant.

7. The system as set forth in claim 6, wherein the encoded data is selected from the set comprising image data and sound data.

8. The system as set forth in claim 6, wherein MIN is estimated according to a formula selected from the group comprising:

Edge-matching ADRC:

$$\text{MIN}' = \frac{1}{N} \cdot \sum_{i=1}^{N}\left[y_i - 0.5 - \left(\frac{DR}{2^Q - 1}\right) \cdot e_i\right]$$

Non edge-matching ADRC:

$$\text{MIN}' = \frac{1}{N} \cdot \sum_{i=1}^{N}\left[y_i - \frac{DR}{2^Q} \cdot (e_i + 0.5)\right]$$

where MIN' is the recovered MIN value, N represents a number of neighboring data to use, Q represents a number of quantization bits used to encode, $e_i$ represents the encoded data of the block, $y_i$ represents decoded data of the neighboring data and DR represents a dynamic range of the block.

9. The system as set forth in claim 6 wherein CEN is estimated according to a formula selected from the group comprising:

Edge-matching:

$$\text{CEN}' = \frac{1}{N} \cdot \sum_{i=1}^{N}\left[y_i - 0.5 - \left(\frac{DR}{2^Q - 1}\right) \cdot e_i\right] + \frac{DR}{2}$$

Non edge-matching:

$$\text{CEN}' = \frac{1}{N} \cdot \sum_{i=1}^{N}\left[y_i - \frac{DR}{2^Q} \cdot (e_i + 0.5)\right] + \frac{DR}{2}$$

where CEN' is the recovered CEN value, N represents a number of neighboring data to use, Q represents a number of quantization bits used to encode, $e_i$ represents encoded data of the block, $e_i$ represents decoded neighboring data and DR represents the dynamic range of the block.

10. The system as set forth in claim 6, wherein DR is estimated according to a formula selected from the group comprising:

Edge-matching ADRC:

$$DR' = \frac{(2^Q - 1) \cdot \sum_{i=1}^{N}(y_i - 0.5 - \text{MIN}) \cdot e_i}{\sum_{i=1}^{N} e_i^2}$$

$$DR' = \frac{(2^Q - 1) \cdot \sum_{i=1}^{N}(y_i - 0.5 - \text{MIN})}{\sum_{i=1}^{N} e_i}$$

Non edge-matching ADRC:

$$DR' = \frac{2^Q \cdot \sum_{i=1}^{N}(y_i - \text{MIN}) \cdot (e_i + 0.5)}{\sum_{i=1}^{N}(e_i + 0.5)^2}$$

$$DR' = \frac{2^Q \cdot \sum_{i=1}^{N}(y_i - \text{MIN})}{\sum_{i=1}^{N}(e_i + 0.5)}$$

where DR' is the recovered DR value, N represents a number of neighboring data to use, Q represents a number of quantization bits used to encode, $q_i$ represents encoded data of the block, $y_i$ represents decoded data of the neighboring data and MIN represents a minimum data value in the block.

11. The system as set forth in claim 6, further comprising full precision registers configured to store a numerator and denomidnator of an equation used to estimate.

12. The system as set forth in claim 6, where in a numerator logic, denominator logic, first shift logic and second shift logic are formed in a processor.

13. A computer readable medium containing executable instructions, which, when executed in a processing system, causes the system to perform the steps for recovery of a compression constant of a bitstream of encoded data, wherein the encoded data comprises compression constants selected from the group comprising MIN, CEN, DR and MAX, wherein MIN represents a minimum data value in the block, CEN represents a central value, DR represents a dynamic range of the block, and MAX represents a maximum data value in the block, the method comprising:

computing a numerator of a quotient determinative of the compression constant to be recovered;

computing a denominator of the quotient;

shifting off a least significant bit from the numerator and the denominator until the numerator and the denominator are less than $2^K$; and performing K-bit division, where K is a constant.

14. The computer readable medium as set forth in claim 13, wherein the encoded data is selected from the set comprising image data and sound data.

15. The computer readable medium as set forth in claim 13, wherein the compression constant is MIN and the quotient is selected from the group comprising:

Edge-matching ADRC:

$$MIN' = \frac{1}{N} \cdot \sum_{i=1}^{N} \left[ y_i - 0.5 - \left(\frac{DR}{2^Q - 1}\right) \cdot e_i \right]$$

Non edge-matching ADRC:

$$MIN' = \frac{1}{N} \cdot \sum_{i=1}^{N} \left[ y_i - \frac{DR}{2^Q} \cdot (e_i + 0.5) \right]$$

where MIN' is the recovered MIN value, N represents a number of neighboring data to use, Q represents a number of quantization bits used to encode, $e_i$ represents the encoded data of the block, $y_i$ represents decoded data of the neighboring data and DR represents the dynamic range of the block.

16. The computer readable medium as set forth in claim 13, wherein the compression constant is CEN and the quotient is selected from the group comprising:

$$CEN' = \frac{1}{N} \cdot \sum_{i=1}^{N} \left[ y_i - 0.5 - \left(\frac{DR}{2^Q - 1}\right) \cdot e_i \right] + \frac{DR}{2}$$

Non edge-matching:

$$CEN' = \frac{1}{N} \cdot \sum_{i=1}^{N} \left[ y_i - \frac{DR}{2^Q} \cdot (e_i + 0.5) \right] + \frac{DR}{2}$$

where CEN' is the recovered CEN value, N represents a number of neighboring data to use, Q represents a number of quantization bits used to encode, $e_i$ represents encoded data of the block, $e_i$ represents decoded neighboring data and DR represents the dynamic range of the block.

17. The computer readable medium as set forth in claim 13, wherein the compression constant is DR and the quotient is selected from the group comprising:

Edge-matching ADRC:

$$DR' = \frac{(2^Q - 1) \cdot \sum_{i=1}^{N} (y_i - 0.5 - MIN) \cdot e_i}{\sum_{i=1}^{N} e_i^2}$$

$$DR' = \frac{(2^Q - 1) \cdot \sum_{i=1}^{N} (y_i - 0.5 - MIN)}{\sum_{i=1}^{N} e_i}$$

Non edge-matching ADRC:

$$DR' = \frac{2^Q \cdot \sum_{i=1}^{N} (y_i - MIN) \cdot (e_i + 0.5)}{\sum_{i=1}^{N} (e_i + 0.5)^2}$$

$$DR' = \frac{2^Q \cdot \sum_{i=1}^{N} (y_i - MIN)}{\sum_{i=1}^{N} (e_i + 0.5)}$$

where DR' is the recovered DR value, N represents a number of neighboring data to use, Q represents a number of quantization bits used to encode, $q_i$ represents encoded data of the block, $y_i$ represents decoded data of the neighboring data and MIN represents a minimum data value in the block.

18. An apparatus for recovering at least one lost/damaged compression constant for a block of encoded data, wherein the encoded data comprises image data and each block comprises MIN, CEN, DR and MAX compression constants selected from the group compressions, wherein MIN represents a minimum data value in the block, CEN represents a central value, DR represents a dynamic range of the block, and MAX represents a maximum data value in the block, the method comprising:

means for computing a numerator of a quotient determinative of the compression constant to be recovered;

means for computing a denominator of the quotient;

means for shifting off a least significant bit from both the numerator and the denominator until the numerator and the denominator are less than $2^K$; and means for performing K-bit division, where K is a constant.

* * * * *